(12) United States Patent
Hashimoto et al.

(10) Patent No.: US 8,404,407 B2
(45) Date of Patent: Mar. 26, 2013

(54) MASK BLANK, MASK BLANK MANUFACTURING METHOD, TRANSFER MASK, AND TRANSFER MASK MANUFACTURING METHOD

(75) Inventors: Masahiro Hashimoto, Tokyo (JP); Hiroshi Shirotori, Tokyo (JP); Yuusuke Honma, Tokyo (JP); Mitsuhiro Shirakura, Tokyo (JP)

(73) Assignee: Hoya Corporation, Tokyo (JP)

( * ) Notice: Subject to any disclaimer, the term of this patent is extended or adjusted under 35 U.S.C. 154(b) by 191 days.

(21) Appl. No.: 12/973,046

(22) Filed: Dec. 20, 2010

(65) Prior Publication Data

US 2011/0183240 A1 Jul. 28, 2011

(30) Foreign Application Priority Data

Dec. 21, 2009 (JP) ................................ 2009-289043

(51) Int. Cl.
*G03F 1/20* (2012.01)

(52) U.S. Cl. ............ 430/5; 430/296; 430/328; 430/394; 430/942

(58) Field of Classification Search .............. 430/5, 296, 430/328, 394, 942
See application file for complete search history.

(56) References Cited

FOREIGN PATENT DOCUMENTS

JP 2005-92241 A 4/2005

*Primary Examiner* — Christopher Young
(74) *Attorney, Agent, or Firm* — Sughrue Mion, PLLC

(57) ABSTRACT

According to certain embodiments, a mask blank for an electron beam writing is provided, capable of forming a resist pattern of a 3-dimensional topology through an one-time writing. The mask blank includes a substrate, a thin film formed on the substrate, and an electron beam resist film formed on the thin film. The electron beam resist film is made of a laminated film including at least a lower resist film and an upper resist film. The lower resist film and the upper resist film have different resist sensitivities with respect to an electron beam.

11 Claims, 9 Drawing Sheets

MASK BLANK, MASK BLANK MANUFACTURING METHOD, TRANSFER MASK, AND TRANSFER MASK MANUFACTURING METHOD

CROSS-REFERENCE TO RELATED APPLICATIONS

This application is based upon and claims the benefit of priority from Japanese Patent Application No. 2009-289043, filed on Dec. 21, 2009, the entire contents of which is incorporated herein by reference.

TECHNICAL FIELD

Embodiments described herein relate generally to a mask blank, a mask blank manufacturing method, a transfer mask, and a transfer mask manufacturing method.

BACKGROUND

In general, during a manufacturing process of a semiconductor device, fine patterns are formed by using photolithography. During the formation of the fine patterns, several substrates, referred to as transfer masks (e.g., photomasks), are used. Such transfer masks are fabricated by forming fine patterns having metal thin films and the like on a transparent glass substrate. Photolithography is also used in the manufacturing process of the transfer mask.

As a kind of the transfer mask, a halftone phase shift mask is known in addition to a binary mask with a light-shielding film pattern which is made of chromium-based materials formed on a transparent substrate.

This halftone phase shift mask further includes a light-shielding film pattern (e.g., a light-shielding band) made mainly of chromium at an outer circumference of a transfer region on a semi-transmitting film pattern. Although being repeatedly used as a reticle of a stepper, the halftone phase shift mask strictly shields light incident on portions which should not be exposed, by the light-shielding film pattern (for example, See Japanese laid-upon Patent Publication No. 2005-92241).

Such halftone phase shift masks are fabricated through a series of processes as follows: writing a desired pattern on a first resist film formed on a mask blank, developing the first resist film to form a resist pattern, etching a light-shielding film using the resist pattern to form a light-shielding film pattern, etching a semi-transmitting film using the light-shielding film pattern to form a semi-transmitting film pattern, and stripping the residual first resist film. Afterwards, a series of subsequent processes are performed as follows: applying a second resist film, writing a desired pattern on the second resist film, developing the second resist film to form a resist pattern, etching a light-shielding film using the resist pattern to form a light-shielding film pattern (e.g., a light-shielding band), and stripping the residual second resist film.

As described above, during the manufacturing process of a halftone phase shift mask, it is necessary to repeat the processes of applying, writing, developing, and stripping of a resist two times in order to form the light-shielding band. Therefore, the repetitive processes are time-consuming and labor intensive increasing cost. Specifically, if the second resist film is exposed using an electron beam writing apparatus, fabrication time is dramatically increased thereby affecting the lead time in a production line.

Moreover, to follow a recent pattern of miniaturization, high fabrication accuracy of the second resist film is highly recommended. Therefore, it is necessary to upgrade alignment accuracy to the exposed portions. The manufacturing process, however, does not fully satisfy the abovementioned accuracy requirements.

Such problem occurs during not only the manufacture of the halftone phase shift mask with the light-shielding band but also the manufacture of a 3-dimensional mask with different fabrication depths, such as a patch of a tri-tone phase shift mask or an enhancer mask.

SUMMARY

To address the above mentioned problems, the present disclosure provides configurations as follows.

(Configuration 1) A mask blank for an electron beam writing forming a resist pattern may include a substrate, a thin film formed on the substrate, and an electron beam resist film formed on the thin film. The electron beam resist film may be made of a laminated film including at least a lower resist film and an upper resist film. The lower resist film and the upper resist film may have different resist sensitivities with respect to an electron beam.

(Configuration 2) The mask blank for an electron beam writing recited in Configuration 1, wherein the lower and upper resist films may be a negative type, and a resist sensitivity of the upper resist film may be lower than that of the lower resist film.

(Configuration 3) The mask blank for an electron beam writing recited in Configuration 1, wherein the lower and upper resist films may be a positive type, and a resist sensitivity of the upper resist film may be higher than that of the lower resist film.

(Configuration 4) The mask blank for an electron beam writing recited in Configuration 1, wherein the lower resist film may be a positive type, the upper resist film may be a negative type, and a resist sensitivity of the upper resist film may be higher than that of the lower resist film.

(Configuration 5) The mask blank for an electron beam writing recited in any one of Configurations 1 to 4, wherein the lower and upper resist films may be a chemically amplified resist film.

(Configuration 6) The mask blank for an electron beam writing recited in any one of Configurations 1 to 5, wherein the upper resist film may be made of a material having a bake temperature lower than the lower resist film.

(Configuration 7) The mask blank of an electron beam writing recited in any one of Configurations 1 to 6, wherein a thickness of the lower resist film may correspond to that of the upper resist film.

(Configuration 8) The mask blank for an electron beam writing recited in any one of Configurations 1 to 7, wherein a middle layer may be interposed between the lower and upper resist films.

(Configuration 9) A method of manufacturing a mask blank for an electron beam writing forming a resist pattern may comprise forming a thin film on a substrate, forming a lower electron beam resist film on the thin film, and forming an upper electron beam resist film directly upon the lower electron beam resist film, or indirectly thereupon by interposing a middle layer between the lower and upper electron beam resist films. The lower and upper electron beam resist films may have different resist sensitivities with respect to an electron beam.

(Configuration 10) A method of manufacturing a transfer mask by using the mask blank recited in any one of Configurations 1 to 9 may comprise writing a high-sensitivity resist film out of the lower and upper resist films using a low dose amount and a low-sensitivity resist film out of the lower and upper resist films using a high dose amount, to thereby form a resist pattern with steps thereon.

(Configuration 11) A transfer mask may be manufactured by using the transfer mask manufacturing method recited in Configuration 10.

According to one aspect of the present disclosure, a 3-dimensional resist pattern may be formed by one-time writing. Therefore, it is possible to reduce the mask manufacturing process in comparison with a mask manufacturing method performing the applying, writing, developing, and stripping of a resist two times. Further, it is possible to realize the decrease in a fabrication time and in cost. Moreover, it is possible to increase mask fabrication accuracy since the one-time writing can effectively prevent a writing position misalignment, which may be induced from the mask manufacturing method performing the applying, writing, developing, and stripping of a resist two times.

According to another aspect of the present disclosure, during the manufacture of the halftone phase shift mask with the light-shielding band or the process of the patch of the tri-tone phase shift mask, a 3-dimensional electron beam resist pattern may be formed by one-time writing. Moreover, it is possible to realize a mask blank and a mask blank manufacturing method capable of forming patterns (for example, a line-and-space, an isolated line, and an isolation space) in critical dimension (CD) accuracy as defined in a design value.

According to yet another aspect of the present disclosure, during the manufacture of the halftone phase shift mask with the light-shielding band or the process of the patch of the tri-tone phase shift mask, the 3-dimensional electron beam resist pattern may be formed by the one-time writing as well as it is possible to realize the mask blank and the mask blank manufacturing method without performing the stripping and removing of the resist pattern.

According to still another aspect of the present disclosure, it is possible to realize a manufacturing method for preventing the upper resist pattern from being partially or entirely removed along with the middle layer underneath the upper resist pattern.

DETAILED DESCRIPTION

Figure 1A:
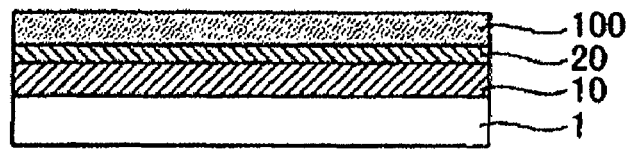
FIGS. 1A to 1G are illustrative sectional views showing a transfer mask manufacturing process by using a mask blank in accordance with Example 1 of the present disclosure.

Hereinafter, Embodiments in accordance with the present disclosure will be described with reference to the accompanying drawings.

A mask blank for an electron beam writing forming a resist pattern in accordance with the present disclosure may comprise a substrate, a thin film formed on the substrate, and an electron beam resist film formed on the thin film, wherein the electron beam resist film may be made of a laminated film including at least a lower electron beam resist film and an upper electron beam resist film, and the upper and lower electron beam resist films may have different resist sensitivities with respect to an electron beam (Configuration 1).

In the present disclosure, Embodiments of the mask blank, which may be made of the laminated film with at least the lower and upper electron beam resist films having different resist sensitivities with respect to an electron beam, are as follows.

(1) Embodiment 1 Lower resist film: a high-sensitivity negative type\Upper resist film: a low-sensitivity negative type (Structure 1) (for example, See FIGS. 1A to 1G and FIGS. 4A to 4G) (corresponding to Configuration 2)

(2) Embodiment 2 Lower resist film: a low-sensitivity positive type\Upper resist film: a high-sensitivity positive type (Structure 2) (for example, See FIGS. 2A to 2H and FIGS. 5A to 5G) (corresponding to Configuration 3)

(3) Embodiment 3 Lower resist film: a low-sensitivity positive type\Upper resist film: a high-sensitivity negative type (Structure 3) (for example, See FIGS. 3A to 3H and FIGS. 6A to 6H) (corresponding to Configuration 4)

(4) Embodiment 4 Lower resist film: a high-sensitivity negative type\Middle layer\Upper resist film: a low-sensitivity negative type (Structure 4) (for example, See FIGS. 1A to 1G and FIGS. 4A to 4G) (corresponding to Configurations 2 and 8)

(5) Embodiment 5 Lower resist film: a low-sensitivity positive type\Middle layer\Upper resist film: a high-sensitivity positive type (Structure 5) (for example, See FIGS. 2A to 2H and FIGS. 5A to 5G) (corresponding to Configurations 3 and 8)

(6) Embodiment 6 Lower resist film: a low-sensitivity positive type\Middle layer\Upper resist film: a high-sensitivity negative type (Structure 6) (for example, See FIGS. 3A to 3H and FIGS. 6A to 6H (corresponding to Configurations 4 and 8)

In accordance with Embodiments 1 to 6 of the present disclosure, a high-sensitivity resist film may be written using a low dose amount and a low-sensitivity resist film may be written using a high dose amount, to thereby form a 3-dimensional resist pattern having steps thereon (in different fabrication depths) (for example, See FIGS. 1A to FIGS. 6H).

In accordance with the present disclosure, an electron beam may pass through the upper and lower resist films such that it may be possible to sufficiently expose the lower resist film.

As described above, Embodiment 1 (e.g., Structure 1) in accordance with the present disclosure may be made of a lower resist film of a high-sensitivity negative type and an upper resist film of a low-sensitivity negative type.

Figure 8:
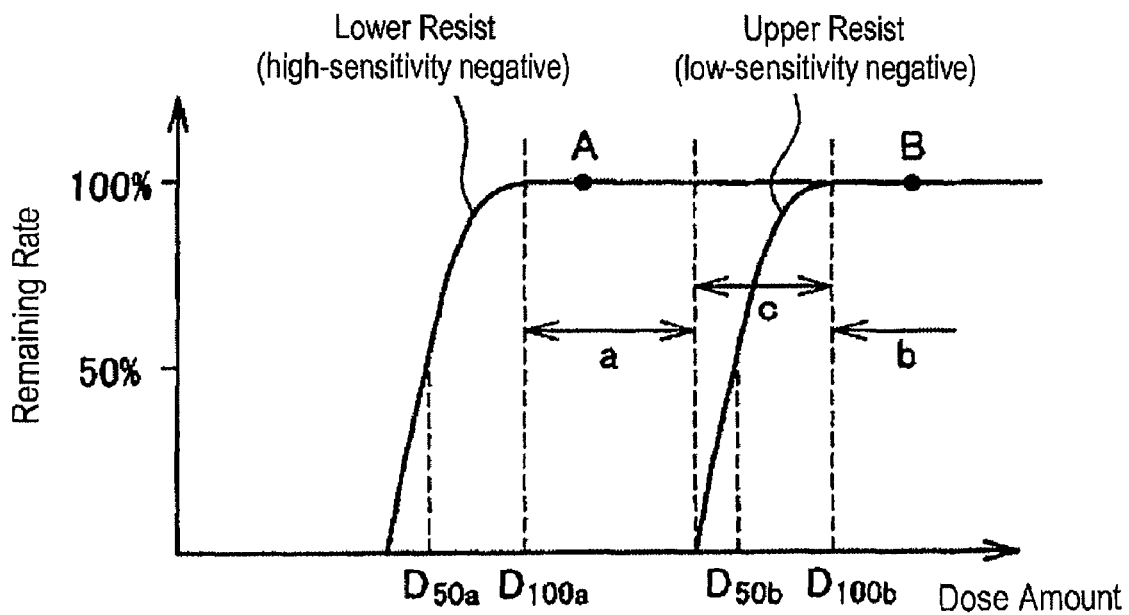
FIG. 8 is another exemplary diagram showing a dose amount and a sensitivity difference.

As shown in FIG. 8, writing may be performed using a low dose amount A (e.g., a low intensity electron beam) suitable for sufficiently exposing the lower high-sensitivity negative resist film (resulting in a remaining rate of about 100% by development) and preventing the upper low-sensitivity negative resist film from being exposed (resulting in a remaining rate of 0% by development). In this way, a portion whose the writing was performed using the low dose amount A may have a step thereon (corresponding to a thickness of the upper or lower resist film) with respect to neighboring regions which were not written using the low dose amount A.

Next, writing may be performed using a high dose amount B (e.g., a high intensity electron beam) suitable for sufficiently exposing the upper low-sensitivity negative resist film (resulting in a remaining rate of about 100% by development) and the lower high-sensitivity negative resist film (resulting in a remaining rate of about 100% by development). In this way, a portion whose the writing was performed using the high dose amount B may have a step thereon (corresponding to the sum of thicknesses of the upper and lower resist films, or a thickness of the upper resist film) with respect to neighboring regions which were not written using the high dose amount B.

Figure 10A:
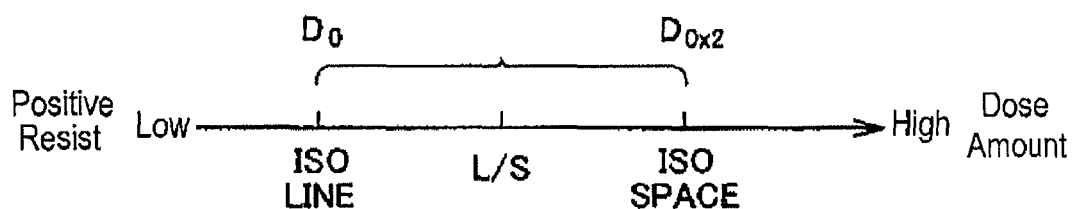
FIGS. 10A and 10B are diagrams showing a dose amount according to a pattern density.
Figure 10B:
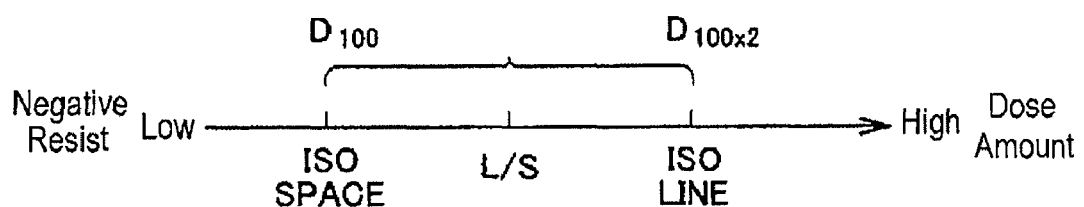

With reference to FIG. 8, in some embodiments the high dose amount B may be greater than twice the low dose amount A. This is the reason why a dose amount being effectively applied to a pattern under the process of writing is varied depending upon a pattern density by the influence of electron beams transferred from the neighboring regions (e.g., the proximity effect). As shown in FIG. 10B, in case that a negative-type resist film is used, it may be desirable to relatively increase a dose amount of an isolated line (ISO LINE) because the written portion is patterned to induce the decrease of a dose amount transferred from the neighboring regions. On the contrary, it may be desirable to relatively decrease a dose amount of an isolation spice (ISO SPACE) because the neighboring regions are written and then the non-written portions are patterned to induce the increase of a dose amount transferred from the neighboring regions. A dose amount of a line-and-space (L&S) may exist between the dose amounts of the isolated line (ISO LINE) and the isolation space (ISO SPACE) since dose amounts transferred to and from the neighboring regions are approximately the same. In case that the dose amount of the isolation space (ISO SPACE) may be established to $D_{100}$, the dose amount of the isolated line (ISO LINE) may be greater than twice $D_{100}$. Also, in some embodiments a dose gap ($D_{100b}$-$D_{100a}$) may be greater than approximately twice $D_{100a}$.

As described above, a range of an optimal dose amount for the purpose of a critical dimension (CD) control may be limited. Therefore, in some embodiments the high dose amount B may be greater than approximately twice the low dose amount A, since a dose amount should be controlled depending upon the pattern density for the purpose of CD control (i.e., in order to realize CD accuracy as defined in a design value regardless of the pattern density).

Also, in a preceding mask process, since an electron beam having energy of 50 KeV is generally irradiated, an energy diffusion area is greater than a light exposing area to induce energy interaction into the entire surface of a substrate. To compensate the energy interaction, the intensity of an electron beam may be controlled to an exposing point according to a writing density in an electron beam writing (exposing) apparatus, thereby securing a sufficient dose gap over a light exposure.

As shown in FIG. 8, a dose amount range "a" capable of sufficiently exposing the lower high-sensitivity negative resist film only is extensively wide such that it may increase a sensitivity difference between the lower and upper resist films. Owing to the extensive range "a," it may be easy to optimally control a dose amount depending upon the pattern density of the lower resist film for the purpose of the CD control thereof, when writing is performed using the low dose amount A (e.g., a low intensity electron beam) capable of sufficiently exposing the lower high-sensitivity negative resist film. Also, owing to the extensive range "a," it may be easy to control a dose amount depending upon the pattern density of the upper resist film for the purpose of the CD control thereof, when writing is performed using the high dose amount B (e.g., a high intensity electron beam) capable of sufficiently exposing the upper low-sensitivity negative resist film. Further, it may be possible to extend the range "a" by adopting a resist of a high contrast characteristic, which expresses an abrupt-slop variation of a remaining rate from 0% to 100% within, for example, a range "c" on a sensitivity curve of the upper low-sensitivity negative resist film.

In FIG. 8, if the range "a" is narrow or the range "c" is superposed with the range "a," the sensitivity difference between the upper and lower resist films may be decreased so that it is difficult to form steps in accordance with the present disclosure.

Embodiment 2 (e.g., Structure 2) in accordance with the present disclosure may be made of a lower resist film of a low-sensitivity positive type and an upper resist film of a high-sensitivity positive type.

Figure 7A:
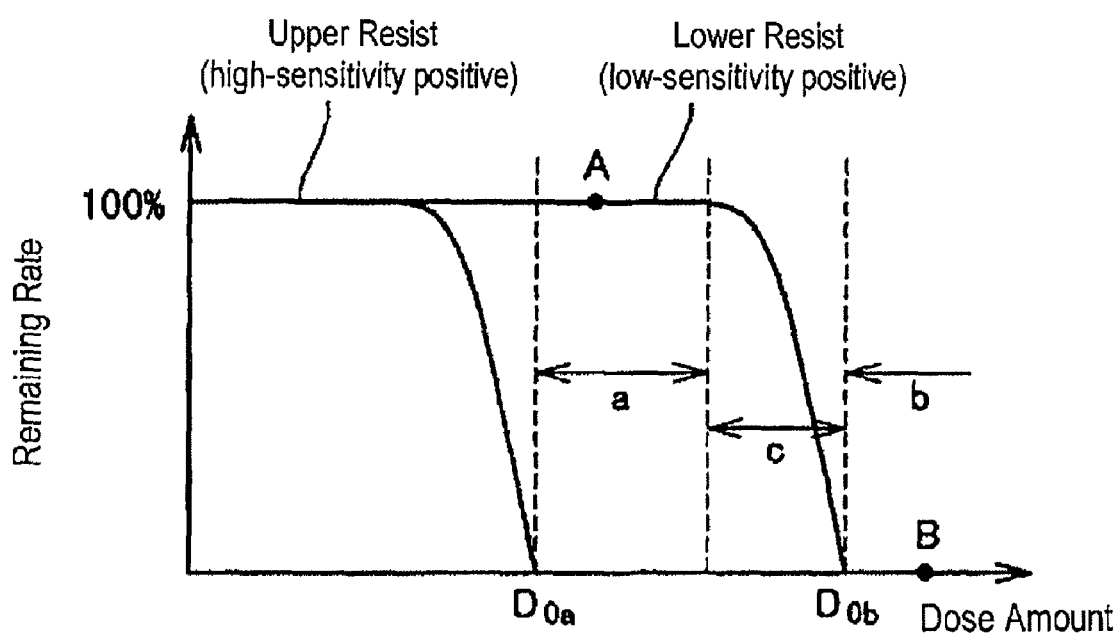
FIGS. 7A and 7B are exemplary diagrams showing a dose amount and a sensitivity difference.
Figure 7B:
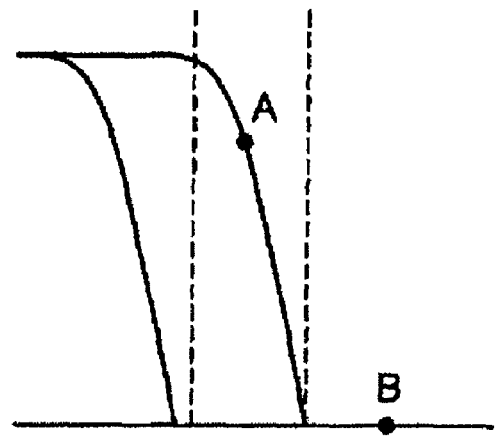

As shown in FIGS. 7A and 7B, writing may be performed using a low dose amount A (e.g., a low intensity electron beam) suitable for sufficiently exposing the upper high-sensitivity positive resist film (resulting in a remaining rate of 0% by development) and preventing the lower low-sensitivity positive resist film from being exposed (resulting in a remaining rate of about 100% by development). In this way, a portion whose the writing was performed using the low dose amount A may have a step thereon (corresponding to a thickness of the upper or lower resist film) with respect to neighboring regions which were not written using the low dose amount A.

Next, writing may be performed using a high dose amount B (e.g., a high intensity electron beam) suitable for sufficiently exposing the lower low-sensitivity positive resist film (resulting in a remaining rate of 0% by development) as well as the upper high-sensitivity positive resist film (resulting in a remaining rate of 0% by development). In this way, a portion whose the writing was performed using the high dose amount B may have a step thereon (corresponding to the sum of thicknesses of the upper and lower resist films, or a thickness of the lower resist film) with respect to neighboring regions which were not written using the high dose amount B.

With reference to FIGS. 7A and 7B, in some embodiments the high dose amount B may be greater than approximately twice the low dose amount A. This is the reason why a dose amount being effectively applied to a pattern under the process of writing is varied depending upon a pattern density by the influence of electron beams transferred from the neighboring regions (e.g., the proximity effect). As shown in FIG. 10A, if a positive-type resist film is used, a dose amount of the isolation space (ISO SPACE) may be relatively increased because the written portion is patterned to induce the decrease of a dose amount transferred from the neighboring regions. On the contrary, in other instances a dose amount of the isolated line (ISO LINE) may be relatively decreased because the neighboring regions are written and the non-written regions are patterned to induce the increase of a dose amount transferred from the neighboring regions. A dose amount of the line-and-space (L&S) may exist between the dose amounts of the isolated line (ISO LINE) and the isolation space (ISO SPACE) since dose amounts transferred to and from the neighboring regions are approximately the same. If the dose amount of the isolated line (ISO LINE) is established to $D_0$, a dose amount of the isolation space (ISO SPACE) may be greater than twice $D_0$. Also, a dose gap ($D_{0b}$-$D_{0a}$) may be greater than approximately twice $D_{0a}$.

As described above, a range of an optimal dose amount for the purpose of a CD control may be limited. Therefore, the high dose amount B may be greater than approximately twice the low dose amount A, since a dose amount should be controlled depending upon a pattern density for the purpose of the CD control.

As shown in FIGS. 7A and 7B, a dose amount range "a" capable of sufficiently exposing the upper high-sensitivity positive resist film only is extensively wide such that in some embodiments it increases a sensitivity difference between the lower and upper resist films. Owing to the extensive range "a," it may be easy to optimally control a dose amount depending upon the pattern density of the upper resist film for the purpose of the CD control thereof, when writing is performed using the low dose amount A (e.g., a low intensity electron beam) capable of sufficiently exposing the upper high-sensitivity positive resist film. Also, owing to the extensive range "a," it may be easy to optimally control a dose amount depending upon the pattern density of the lower resist film for the purpose of the CD control thereof, when writing is performed using the high dose amount B (e.g., a high intensity electron beam) capable of sufficiently exposing the lower low-sensitivity positive resist film. Further, it may be possible to extend the range "a" by adopting a resist of a high contrast characteristic, which expresses an abrupt-slop variation of a remaining rate from 0% to 100% within, for example, a range "c" on a sensitivity curve of the lower low-sensitivity positive resist film.

In FIG. 7B, if the range "c" is superposed with the range "a," the sensitivity difference between the upper and lower resist films is decreased so that it may be difficult to form the steps in accordance with the present disclosure. Also, if the range "a" shown in FIG. 7A is narrow, it may also be difficult to form the steps in accordance with the present disclosure.

Embodiment 3 (e.g., Structure 3) in accordance with the present disclosure may be made of a lower resist film of a low-sensitivity positive type and an upper resist film of a high-sensitivity negative type.

Figure 9:
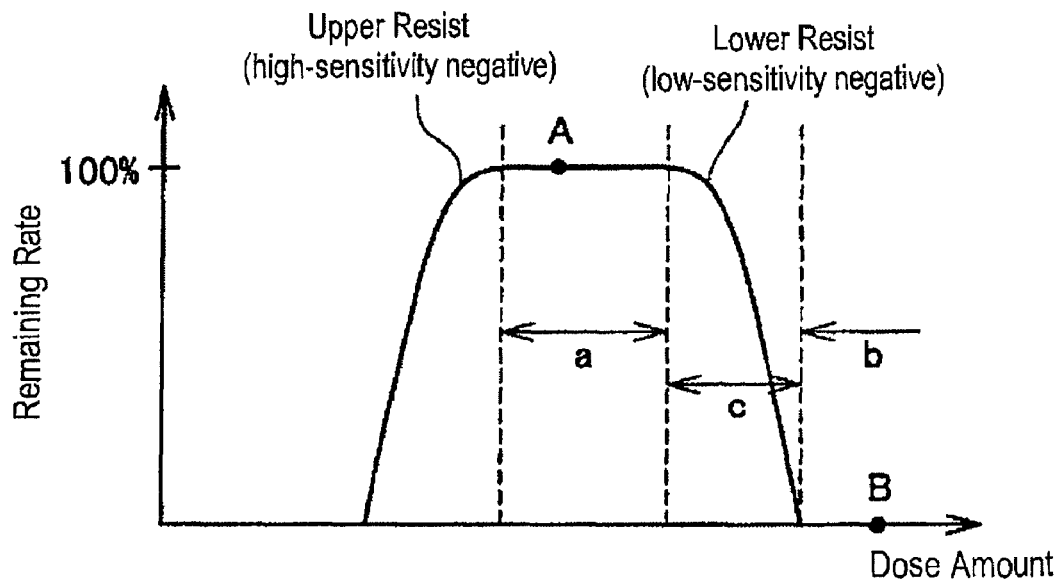
FIG. 9 is yet another exemplary diagram showing a dose amount and a sensitivity difference.

As shown in FIG. 9, writing may be performed using a low dose amount A (e.g., a low intensity electron beam) suitable for sufficiently exposing the upper high-sensitivity negative resist film (resulting in a remaining rate of about 100% by development) and preventing the lower low-sensitivity positive resist film from being exposed (resulting in a remaining rate of about 100% by development). In this way, a portion whose the writing was performed using the low dose amount A may have a step thereon (corresponding to the sum of thicknesses of the upper and lower resist films, or a thickness of the upper resist film) with respect to neighboring regions which were not written using the low dose amount A.

Next, writing may be performed using a high dose amount B (e.g., a high intensity electron beam) suitable for sufficiently exposing the lower low-sensitivity positive resist film (resulting in a remaining rate of 0% by development). During this process, the upper high-sensitivity negative resist film may be sufficiently exposed using the high dose amount B (resulting in a remaining rate of about 100% by development), but the exposed portions of the upper resist film may be removed along with the lower resist film. In this way, the exposed portions whose the writing was performed using the high dose amount B may have a step thereon (corresponding to the sum of thicknesses of the upper and lower resist films, or a thickness of the lower resist film).

Also, the non-written regions of the upper high-sensitivity negative resist film whose the writing was not performed using the low and high dose amounts A and B may be removed by developing (resulting in a remaining rate of 0% by development). On the contrary, the non-written regions of the lower low-sensitivity positive resist film whose the writing was not performed using the low and high dose amounts A and B may be left by developing (resulting in a remaining rate of about 100% by development).

In FIG. 9, in some embodiments the high dose amount B may be greater than twice the low dose amount A, as described above.

As shown in FIG. 9, a dose amount range "a" capable of sufficiently exposing the upper high-sensitivity negative resist film only is extensively wide such that a sensitivity difference between the lower and upper resist films is increased. Owing to the extensive range "a," it may be easy to optimally control a dose amount depending upon the pattern density of the upper resist film for the purpose of the CD control thereof, when writing is performed using the low dose amount A (e.g., a low intensity electron beam) capable of sufficiently exposing the upper high-sensitivity negative resist film. Also, owing to the extensive range "a," it may be easy to optimally control a dose amount depending upon the pattern density of the lower resist film for the purpose of the CD control thereof, when writing is performed using the high dose amount B (e.g., a high intensity electron beam) capable of sufficiently exposing the lower low-sensitivity positive resist film. Further, it may be possible to extend the range "a" by adopting a resist of a high contrast characteristic, which expresses an abrupt-slop variation of a remaining rate from 0% to 100% within, for example, a range "c" on a sensitivity curve of the lower low-sensitivity positive resist film.

In FIG. 9, if the range "a" is narrow or the range "c" is superposed with the range "a," the sensitivity difference between the upper and lower resist films is decreased so that it is difficult to form the steps in accordance with the present disclosure.

Embodiments 1 to 6 provide an electron beam resist film for use in forming a light-shielding band on a halftone phase shift mask with an electron beam resist using a reduced mask manufacturing process in accordance with the present disclosure.

Also, Embodiments 1 to 6 provide an electron beam resist film for use in forming a light-shielding band and a patch on a tri-tone phase shift mask with an electron beam resist by using a reduced mask manufacturing process in accordance with the present disclosure.

In accordance with Embodiments 1 to 6 of the present disclosure, there is no need to perform the applying, writing, developing, and stripping of a resist two times. Therefore, it is possible to reduce a mask manufacturing process, thereby inducing the decrease in a fabrication time and in cost. Also, in accordance with Embodiments 1 to 6 of the present disclosure, it is possible to realize a manufacturing process of a halftone phase shift mask with a light-shielding band and a patch of a tri-tone phase shift mask without performing the stripping and removing of a resist pattern.

In accordance with the present disclosure, a low dose amount may dissolve only a lower resist film in the following combinations: a lower resist film of a low-sensitivity negative type and an upper resist film of a high-sensitivity positive type; a lower resist film of a high-sensitivity negative type and an upper resist film of a low-sensitivity positive type; and a lower resist film of a high-sensitivity positive type and an upper resist film of a low-sensitivity negative type. Consequently, these combinations may not be suitable for forming a light-shielding band. For example, these combinations may not be used to form a light-shielding band of the halftone phase shift mask.

Also, in accordance with the present disclosure, a low dose amount may dissolve only a lower resist film in the following combinations: a lower resist film of a high-sensitivity positive type and an upper resist film of a low-sensitivity positive type; and a lower resist film of a low-sensitivity negative type and an upper resist film of a high-sensitivity negative type. Consequently, these combinations may not suitable for forming a pattern.

An electron beam resist in accordance with the present disclosure may include a chemically amplified resist, a main-chain-fragmentation resist, and a crosslinked resist.

In accordance with the present disclosure, the developing scheme of a lower resist and an upper resist may be homogeneous or heterogeneous. For example, the developing scheme may include the following combinations: a chemically amplified resist and a main-chain-fragmentation resist; and a chemically amplified resist and a crosslinked resist.

In accordance with the present disclosure, in some embodiments the electron beam resist may be a chemically amplified resist, since a developer for the main-chain-fragmentation resist and the crosslinked resist is an organic solvent, thereby making it difficult to select a middle layer (Configuration 5).

Also, in accordance with the present disclosure, since the chemically amplified resist has a high contrast characteristic expressing an abrupt-slope sensitivity curve, it is easy to control a dose amount. Further, the main-chain-fragmentation resist or the crosslinked resist has a contrast characteristic lower than the chemically amplified resist.

Examples of electron beam resists applicable to the present disclosure are described below along with sensitivity and a pre-bake temperature.

(1) FEP171: a positive-type resist, 10 $\mu C/cm^2$, 140° C. (produced by FUJIFILM Electronic Materials Co., Ltd.)

(2) PRL009: a positive-type resist, 30 $\mu C/cm^2$, 130° C. (produced by FUJIFILM Electronic Materials Co., Ltd.)

(3) FEN270: a negative-type resist, 10 $\mu C/cm^2$, 130° C. (produced by FUJIFILM Electronic Materials Co., Ltd.)

(4) SLV12M: a negative-type resist, 20 $\mu C/cm^2$, 120 to 130° C. (produced by FUJIFILM Electronic Materials Co., Ltd.)

In accordance with the present disclosure, a lower resist may be applied and then pre-baked. Subsequently, an upper resist may be applied and then pre-baked. Therefore, in some embodiments a pre-bake temperature of the upper resist may be equal to or lower than that of the lower resist (Configuration 6).

In accordance with the present disclosure, any kind of thin films capable of being used to form a 3-dimensional mask may be employed.

In accordance with the present disclosure, a film containing metal and/or silicide may be used as a thin film.

For example, a film containing metal may be made of one or more elements selected from a group consisting of aluminum, titanium, vanadium, chromium, zirconium, niobium, molybdenum, lanthanum, tantalum, tungsten, silicon, and hafnium, or made of a material containing these elements or an alloy thereof. In addition, the film containing metal may be made of a layer containing at least one among oxygen, nitrogen, silicon, and carbon. The film containing metal may be fabricated in a laminated structure whose different compositions are sequentially formed or compositions are continuously changed. Also, a silicided metal may be substituted to the metal contained in the film.

The present disclosure may be applicable to a halftone or tri-tone phase shift mask blank with the thin film made of a semi-transmitting film and a light-shielding film formed thereon. A phase shift mask fabricated from the phase shift mask blank may be made of a semi-transmitting film pattern formed on a transparent substrate and a light-shielding film pattern formed on the semi-transmitting film pattern, in order to prevent a pattern badness of a substrate whose patterns were transmitted by the semi-transmitting film pattern being formed on a transfer region according to a light that passes the semi-transmitting film.

The present disclosure may be applicable to a phase shift mask blank, which is made of the thin film including a light-shielding film or a semi-transmitting film, for a substrate dug-down (carved) Levenson-type phase shift mask, a chromium-less phase shift mask, and an enhancer-type phase shift mask. A phase shift mask fabricated from the phase shift mask blank may be provided with a shifter portion that is formed by etching a transparent substrate.

In accordance with the present disclosure, the light-shielding film may include a single-layered or laminated structure.

Also, the light-shielding film may include an antireflection film.

The light-shielding film may further include a composition gradient film.

Moreover, the light-shielding film may be made of a three-layered structure including a back-surface antireflection layer, a light-shielding layer, and a front-surface antireflection layer.

Also, the light-shielding film may be made of a two-layered structure including a light-shielding layer and a front-surface antireflection layer.

In accordance with the present disclosure, a chromium-based thin film may be used as the light-shielding film, The chromium-based thin film may be made of a chromium alone or a material containing chromium and at least one element among oxygen, nitrogen, carbon, and hydrogen (for example, a film composed mainly of chromium or a material containing chromium).

Among these materials, in some embodiments the light-shielding film may be made of a material composed mainly of at least one among chromium nitride, chromium oxide, chromium oxynitride, and chromium oxycarbonitride.

In accordance with the present disclosure, the light-shielding film may be made of a MSi-based thin film composed mainly of transition metal silicide.

The MSi-based thin film may be made of a compound composed of at least one among nitrogen, oxygen, carbon, hydrogen, and inert gas (e.g., helium, argon, xenon, and the like) in addition to transition metal silicide. Herein, a transition metal (M) may be selected one from a group consisting of molybdenum (Mo), tantalum (Ta), chromium (Cr), tungsten (W), titanium (Ti), zirconium (Zr), vanadium (V), niobium (Nb), nickel (Ni), and palladium (Pb), or an alloy thereof.

In accordance with the present disclosure, the light-shielding film may be made of a film composed mainly of at least one among molybdenum silicide, molybdenum silicide nitride, molybdenum silicide oxide, and molybdenum silicide nitride oxide.

Also, in case that an electron beam resist is applied on the MSi-based thin film, a hydrophobic surface is formed by contacting to hexamethyl disilazane (HMDS) transpired using nitrogen gas, thereby increasing adhesion between the electron beam resist and the MSi-based thin film.

In accordance with the present disclosure, the semi-transmitting film may include a single-layered structure, a two-layered structure made of a low-transmitting layer and a high-transmitting layer, and a multi-layered structure.

The semi-transmitting film may include a high-transmitting type. The high-transmitting type may have a high transmittance of 10 to 40% relative to a conventional transmittance of, for example, less 1 to 10%.

In accordance with the present disclosure, the semi-transmitting film (e.g., a phase shift film) may be made of a film composed mainly of metal silicide.

The film composed mainly of metal silicide may include a compound containing at least one among nitrogen, oxygen, carbon, hydrogen, and inert gas (e.g., helium, argon, xenon, and the like) in addition to transition metal silicide. Herein, a transition metal (M) may be selected one from a group consisting of molybdenum (Mo), tantalum (Ta); chromium (Cr), tungsten (W), titanium (Ti), zirconium (Zr), vanadium (V), niobium (Nb), nickel (Ni), and palladium (Pb), and or alloy thereof.

In accordance with the present disclosure, the semi-transmitting film may be made of a film composed mainly of at least one among molybdenum silicide, molybdenum silicide nitride, molybdenum silicide oxide, and molybdenum silicide nitride oxide.

In accordance with the present disclosure, the phase shift film may be made by laminating a phase control layer and a transmittance control layer.

Herein, the transmittance control layer may be made of a film composed of one or more elements selected from a group consisting of aluminum, titanium, vanadium, chromium, zirconium, niobium, molybdenum, lanthanum, tantalum, tungsten, silicon, and hafnium, or oxide, nitride, nitride oxide, and carbide of the selected element. Also, in some embodiments the phase control layer may be made of a thin film composed of a silicon parent compound such as silicon oxide, silicon nitride, silicon oxynitride, and the like, since the thin film may have a high transmittance relative to an exposing light of an ultraviolet wavelength range.

In accordance with the present disclosure, a film thickness of the lower resist film may correspond to that of the upper resist film (Configuration 7).

In this way, according to Examples 1 to 6 of the present disclosure to be described in later, it is possible to realize a manufacturing process of a halftone phase shift mask with a light-shielding band and a patch of a tri-tone phase shift mask without performing the stripping and removing of a resist pattern.

In accordance with the present disclosure, the lower resist film and the upper resist film may have different film thicknesses, in case that the lower resist film and the upper resist film have different etching resistances. If an etching resistance of the upper resist film is greater than that of the lower resist film, a film thickness of the upper resist film may be thinner than that of the lower resist film.

In accordance with the present disclosure, a middle layer may be interposed between the lower resist film and the upper resist film (Configuration 8).

The middle layer may prevent the upper and lower resists from being mixed with each other.

In accordance with the present disclosure, in some embodiments the middle layer may have the following characteristics of (1) insolubility against a solvent contained in the upper resist and the lower resist, (2) solubility against a developer of the lower resist, (3) a dissolution rate with respect to a developer of the middle layer slower than the developer of the upper resist, and (4) being uniformly applied on the lower resist of below 50 nm.

As described above, in some embodiments the middle layer may have a dissolution rate against the developer of the middle layer to be slower than the developer of the upper resist. However, from the relationship between the dissolution rate and the film thickness of the middle layer, if the dissolution rate against a developer of the upper resist is set V, it is possible to select the dissolution rate of the middle layer against the developer from a range of 5 to 0.5 V.

In accordance with the present disclosure, the middle layer may be made of a water-soluble polymer layer (e.g., polyvinyl alcohol, methyl cellulose aqueous solution, polyvinylpyrrolidone, amylase, and the like).

Also, in accordance with the present disclosure, the middle layer may be made of a water-soluble antireflection film (e.g., AQUATAR), a water-soluble antistatic film (e.g., AquaSAVE and ESPACER), a water-soluble underlying antireflection film (e.g., a water-soluble bark), and the like.

In accordance with the present disclosure, the middle layer may be further made of a material that has been developed as a top coat (e.g., a protective film) of a resist. The middle layer may be a protective layer of the resist, thereby not being mixed with the resist. Also, the middle layer may be hydrophobic, thereby being easily applied. Further, the middle layer may not be soluble against a developer, to thereby require a stripping process.

The present disclosure may be applicable to a mask blank for manufacturing a halftone phase shift mask, a tri-tone phase shift mask, an enhancer mask, a Levenson-type transfer mask for the ArF excimer laser, a transfer mask such as a reflective mask for an extreme ultraviolet (EUV) exposure, and an imprint mold.

The present disclosure may be applicable for processing a workpiece (for example, a base, a substrate, a thin film, and the like) by using a 3-dimensional resist pattern, which is formed through a multi-layered resist of which two or more electron beam resists having the above described characteristics are layered.

In accordance with the present disclosure, a mask blank for an electron beam writing forming a resist pattern may comprise a workpiece, and an electron beam resist film formed on the workpiece, wherein the electron beam resist film may be made of a laminated film including at least a lower resist film and an upper resist film, and the lower resist film and the upper resist film may have different sensitivities with respect to an electron beam.

When a 3-dimensional resist pattern is transferred to the workpiece (for example, a parent compound, a substrate, a thin film, and the like) by dry-etching, an etching depth of the workpiece may be varied in proportion to an etching rate of the laminated-resist.

Also, in case that the workpiece is a single body or a single layer, a film thickness of each resist film may correspond to the etching depth of the workpiece.

For example, in case that a lower resist film and an upper resist film are sequentially layered on a transparent substrate and a film thickness of the lower resist film is thinner than that of the upper resist film, an etch depth of the transparent substrate is as follows. That is, a thickness corresponding to a deep etch depth of the substrate may be a depth (e.g., a step) corresponding to the sum of thicknesses of the lower and upper resist films while a thickness corresponding to a shallow etch depth may be a depth (e.g., a step) corresponding to the thickness of the upper resist film.

In accordance with the present disclosure, the transparent substrate may include a synthetic quartz substrate, a quartz substrate, and various glass substrates (for example, a $CaF_2$ substrate, a soda lime glass substrate, an alumino-silicate glass substrate, a non-alkali glass, a low thermal expansion glass substrate, and the like).

Among these substrates, in some embodiments the quartz substrate may be used as a substrate of a transfer mask and a mask blank in accordance with the present disclosure, since the quartz substrate has high transparency in the wavelength of an ArF excimer laser or a shorter wavelength.

EXAMPLE 1

A synthetic quartz having, for example, a 6-inch square size with a thickness of 0.25 inches may be used as a transparent substrate 1. As shown in FIG. 1A, a semi-transmitting film 10 (e.g., a MoSiN film) made of nitride molybdenum and silicon may be formed on the transparent substrate 1.

For example, by using a molybdenum (Mo) and silicon (Si) mixed target (Mo:Si=10 mol %:90 mol %), the MoSiN film 10 made of molybdenum, silicon, and nitrogen may be formed to have a film thickness of 69 nm through a reactive sputtering (e.g., a direct current (DC) sputtering) at a gas pressure of 0.3 Pa and a DC power of 3.0 KW under a mixed gas atmosphere of argon (Ar), nitrogen ($N_2$), and helium (He) (at a gas flow rate Ar:$N_2$:He=5:49:46). Also, the MoSiN film 10 may have transmittance of 6.11% and a phase difference of 175.6 degrees at an exposing wavelength of 193 nm of the ArF excimer laser.

Next, a light-shielding film 20 may be formed on the semi-transmitting film 10 as shown in FIG. 1A. The light-shielding film 20 may be made of a back-surface antireflection layer, a light-shielding layer, and a front-surface antireflection layer.

For example, by using a Cr target as a sputter target, a CrOCN film is firstly formed to have a film thickness of 30 nm at a gas pressure of 0.2 Pa and a DC power of 1.7 KW by using a mixed gas of Ar, $CO_2$, $N_2$, and He (at a gas flow rate Ar:$CO_2$:$N_2$:He=22:39:6:33) as a sputtering gas. And then, by using the Cr target as a sputter target, a CrN film may be formed to have a film thickness of 4 nm at a gas pressure of 0.1 Pa and a DC power of 1.7 KW by using a mixed gas of Ar and $N_2$ (at a gas flow rate Ar:$N_2$=83:17) as a sputtering gas. Thereafter, by using the Cr target as a sputter target, a CrOCN film may be formed to have a film thickness of 14 nm at a gas pressure of 0.2 Pa and a DC power of 1.8 KW by using a mixed gas of Ar, $CO_2$, $N_2$, and He (at a gas flow rate Ar:$CO_2$:$N_2$:He=21:37:11:31) as a sputtering gas. The back-surface antireflection layer, the light-shielding layer, and the antireflection film formed under the above described conditions may have low-stress characteristics on the entire of the light-shielding film 20 in addition to the semi-transmitting film 10, thereby suppressing variation in a substrate shape at minimum.

Next, a chemically amplified high-sensitivity negative resist 100 (e.g., FEN270 produced by FUJIFILM Electronic Materials Co., Ltd.) for an electron beam may be applied on the light-shielding film 20 by using a spin-coating method and then pre-baked at a temperature of 130° C. for 10 minutes (FIG. 1A). A film thickness and sensitivity of the resist 100 may be 200 nm and 10 µC/cm², respectively.

Figure 11:
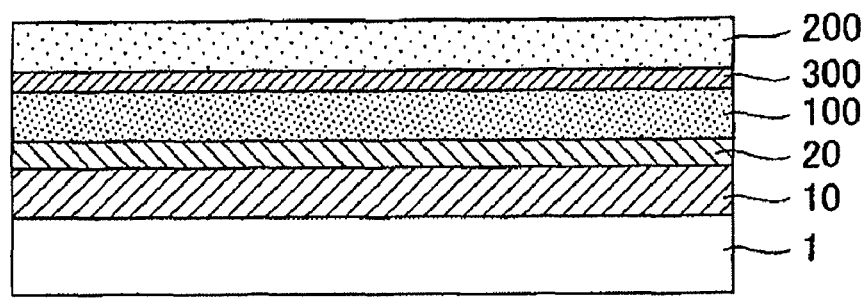
FIG. 11 is a sectional view showing the mask blanks in accordance with Embodiments 1 to 6 of the present disclosure.

And then, a middle layer 300 shown in FIG. 11 may be uniformly applied on the entire surface of the resist 100 by the spin-coating method with a thickness of below 50 nm (e.g., 30 nm).

As the middle layer 300, a water-soluble organic film, preferably, a water-soluble antireflection film, (e.g., AQUATER produced by AZ Electronic Materials Co., Ltd.) may be used.

Figure 1B:
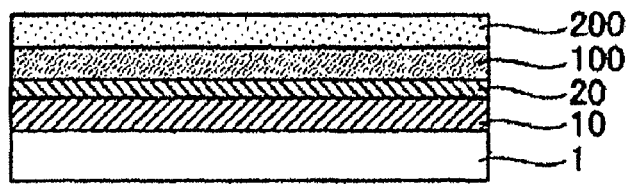

Thereafter, a chemically amplified low-sensitivity negative resist 200 (e.g., SLV12M produced by FUJIFILM Electronic Materials Co., Ltd.) for an electron beam may be applied on the middle layer 300 by using the spin-coating method and then pre-baked at a temperature of 120 to 130° C. for 10 minutes (FIG. 1B). A film thickness and sensitivity of the resist 200 may be 200 nm and 20 µC/cm², respectively.

If it is done as described above, a halftone phase shift mask blank with a two-layered resist film may be fabricated.

Figure 1C:
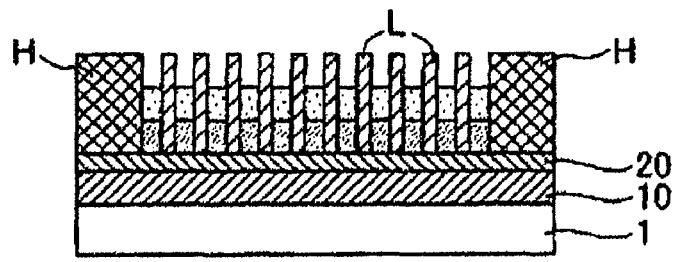

Next, by using an electron beam writing apparatus, writing may be performed using a low dose amount L (e.g., 10 µC/cm²) suitable for preventing the upper low-sensitivity negative resist 200 from being exposed (resulting in a remaining rate of 0% by development) and sufficiently exposing the lower high-sensitivity negative resist 100 (resulting in a remaining rate of about 100% by development) at portions of the outer circumference of a transfer region except a region whose a light-shielding film pattern (e.g., a light-shielding band) is to be formed (FIG. 1C).

At this time, if additional writing is not performed in a subsequent process, the written portions (depicted as diagonal lines shown in FIG. 1C) of the upper low-sensitivity negative resist 200 may be removed by a subsequent developing.

Also, the written portions (depicted as diagonal lines shown in FIG. 1C) of the lower high-sensitivity negative resist 100 may not be removed by a subsequent developing.

Further, during this process, the writing may be performed on the resist 100 by compensating the dose amount according to a pattern density in the electron beam writing apparatus, in order to obtain CD accuracy as defined in a design value for desired patterns (e.g., a line-and-space (L&S) of 200 nm, an isolated line (ISO LINE) of 200 nm, and an isolation space (ISO SPACE) of 200 nm). For example, the compensated dose amounts of the line-and-space, the isolated line, and the isolation space may be 10 µC/cm², 16 µC/cm², and 8 µC/cm², respectively.

Thereafter, by using the electron beam writing apparatus, writing may be performed using a high dose amount H (e.g., 20 µC/cm²) for exposing the upper low-sensitivity negative resist 200 at the portions whose the light-shielding band is to be formed (FIG. 1C).

At this time, the written portions (depicted as crossed diagonal lines shown in FIG. 1C) of the upper low-sensitivity negative resist 200 may not be removed by a subsequent developing. And, the written portions (depicted as crossed diagonal lines shown in FIG. 1C) of the lower high-sensitivity negative resist 100 may not be removed by a subsequent developing.

Also, in accordance with an aspect of Example 1, the sequence order of writings using the low dose amount L and the high dose amount H may be reversible.

Figure 1D:
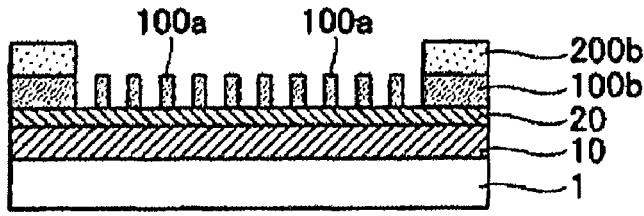

Thereafter, developing may be performed with a developer (e.g., TMAH) to form a resist pattern 100a along with a resist pattern made of a lamination, which may be comprised of resist patterns 100b and 200b in the light-shielding band forming area (FIG. 1D).

During such developing, the middle layer 300 may be dissolved and removed by the developer.

Figure 1E:
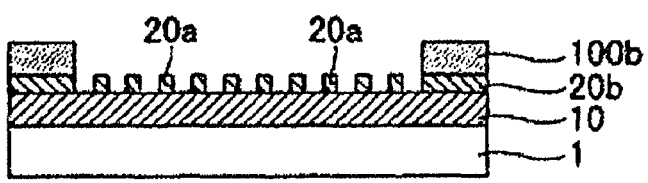

Next, dry-etching may be performed on the light-shielding film 20 being exposed using the resist patterns 100a and 200b to form a light-shielding film pattern 20a and a light-shielding band pattern 20b (FIG. 1E). The dry-etching may be performed by using a dry-etching gas such as a mixed gas of $Cl_2$ and $O_2$ ($Cl_2$:$O_2$=4:1).

During such dry-etching, the resist pattern 100a on the light-shielding film pattern 20a may be nearly removed. Also, the resist pattern 200b in the light-shielding band forming area may be nearly removed.

Figure 1F:
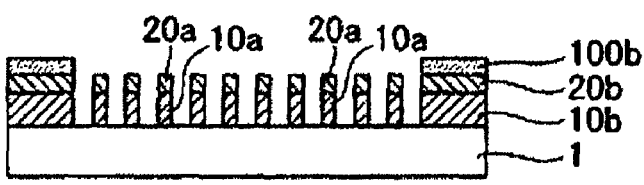

Then, dry-etching may be further performed on the semi-transmitting film 10 being exposed using the light-shielding film pattern 20a to form a semi-transmitting film pattern 10a (FIG. 1F). The dry-etching may be performed by using a dry-etching gas such as a mixed gas of $SF_6$ and He.

During this process, the resist pattern 100b in the light-shielding band forming area may be about to be decreased, but left as much as a film thickness required for a subsequent process at the dry-etching termination time.

Figure 1G:
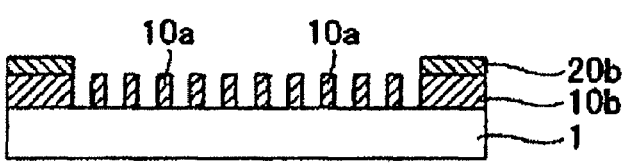

Next, the light-shielding film pattern 20a on the semi-transmitting film pattern 10a may be removed by dry-etching while the light-shielding film pattern 20b (e.g., a light-shielding band) may be protected with the resist pattern 100b in the light-shielding band forming area (FIG. 1G). The dry-etching may be performed by using a dry-etching gas such as a mixed gas of $Cl_2$ and $O_2$ ($Cl_2$:$O_2$=4:1).

During such dry-etching, the resist pattern 100b in the light-shielding band forming area may be removed.

Subsequently, cleaning may be performed on the resultant structure to fabricate a halftone phase shift mask for the ArF excimer laser. Such halftone phase shift mask may be provided with the light-shielding band made of a lamination, which is comprised of the light-shielding film pattern 20a and the semi-transmitting film pattern 10b in the light-shielding band forming area.

According to the above process of Example 1, the desired patterns (e.g., the line-and-space of 200 nm, the isolated line of 200 nm, and the isolation space of 200 nm) may be obtained in the CD accuracy as defined in the design value with respect to the semi-transmitting film pattern 10a.

Also, according to the above process of Example 1, the resist pattern of a 3-dimensional step may be formed by performing the writing of FIG. 1C at once and the developing of FIG. 1D at once. Therefore, it is possible to reduce the mask manufacturing process in comparison with a mask manufacturing process performing the writing and developing twice as well as to realize the decrease in a fabrication time and in cast. Further, according to the above process of Example 1, it is possible to increase mask fabrication accuracy since the writing was performed at once only to thereby effectively prevent a writing position misalignment which may be induced by performing the applying, writing, developing, and stripping of a resist two times.

Moreover, according to the above process of Example 1, since the resist pattern may not be remained so that it is not required to perform the stripping and removing of the resist pattern.

Also, in the process of FIGS. 1C and 1D, the relationship between "a nearly removing" of the resist patterns 200b and 100a and "a nearly remaining" of the resist pattern 100b may be derived from same film thicknesses and same dry-etching rates of the resist 100 and the resist 200. Although the resist patterns 200b and 100a were remained in a small amount, it is not a critical problem because the residual resist patterns 200b and 100a may be securely removed by a subsequent dry-etching. Even though the resist pattern 100b was over-etched, it is not a critical problem as long as the resist pattern 100b can be remained to a film thickness required for a subsequent process at the dry-etching termination time during the process of FIG. 1F.

Moreover, in the process shown in FIG. 1C of Example 1, when writing is performed by varying the dose amount as described above, the upper low-sensitivity negative resist 200 may be exposed in an upper limit of the low dose amount L (for example, the dose amount of the isolated line (ISO LINE)), to thereby make a remaining rate not to be 0% by development if the range "a" shown in FIG. 8 is narrow (i.e., the sensitivity difference between the upper and lower resists is small). As a result, at the time after development shown in FIG. 1D, the pattern of the resist 200 may be considerably remained on the resist pattern 100a. Consequently, at the time shown in FIG. 1E, the resist pattern 100a may be considerably remained on the light-shielding film pattern 20a.

As shown in FIGS. 1E and 1F, when the semi-transmitting film pattern 10a is formed using the light-shielding film pattern 20a by dry-etching, the resist pattern 100a remained considerably on the light-shielding film pattern 20a may cause the increase of a sidewall height of an etching mask pattern as much as the sum of heights of the light-shielding film pattern 20a and the resist pattern 10a. Such increase of the sidewall heights may be improper, since a lower sidewall height of the etching mask pattern results in high accuracy and a low micro-loading to realize a superior fabrication accuracy.

Also, according to Example 1, it is difficult to perform the writing process by compensating the dose amount according to the pattern density in the electron beam writing apparatus if the range "a" shown in FIG. 8 is narrow (i.e., the sensitivity difference between the upper and lower resists is small) or the range "c" is superposed with the range "a." As a result, it is nearly impossible or difficult to obtain the desired patterns (e.g., the line-and-space of 200 nm, the isolated line of 200 nm, and the isolation space of 200 nm) in the CD accuracy as defined in the design value for the semi-transmitting film pattern 10a.

Further, according to Example 1, in case that the dissolution rate of the middle layer 300 against the developer is large or the film thickness of the middle layer 300 is thick, a portion of the resist 200 whose the resist pattern 200b in the light-shielding band forming area is to be formed may be partially or entirely removed along with the middle layer 300 underneath the portion.

EXAMPLE 2

Figure 2A:
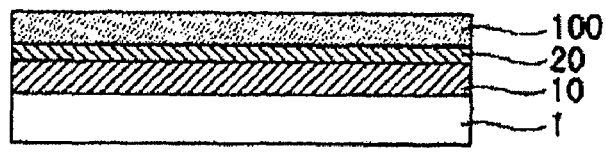
FIGS. 2A to 2H are illustrative sectional views showing a transfer mask manufacturing process by using a mask blank in accordance with Example 2 of the present disclosure.

As shown in FIG. 2A, a semi-transmitting film (MoSiN film) 10 may be formed on a transparent substrate 1 under the same conditions as that in Example 1. The semi-transmitting film 10 may be made of molybdenum nitride and silicon which are the same as in Example 1 and the transparent substrate 1 may be the same as in Example 1.

Next, a light-shielding film 20 may be formed on the semi-transmitting film 10 under the same conditions as that in Example 1 (FIG. 2A). The light-shielding film 20 may be made of a back-surface antireflection layer, a light-shielding layer, and a front-surface antireflection layer, which are the same as in Example 1.

Subsequently, a chemically amplified low-sensitivity positive resist 100 (e.g., PRL009 produced by FUJIFILM Electronic Materials Co., Ltd.) for an electron beam may be applied on the light-shielding film 20 by using a spin-coating method and then pre-baked at a temperature of 130° C. for 10 minutes (FIG. 2A). A film thickness and sensitivity of the resist 100 may be 200 nm and 30 $\mu C/cm^2$, respectively.

And then, a middle layer 300 shown in FIG. 11 may be uniformly applied on the entire surface of the resist 100 to a thickness of below 50 nm (e.g., 30 nm) by the spin-coating method.

As the middle layer 300, a water-soluble organic film, preferably, a water-soluble antireflection film, (e.g., AQUATER produced by AZ Electronic Materials Co., Ltd.) may be used.

Figure 2B:
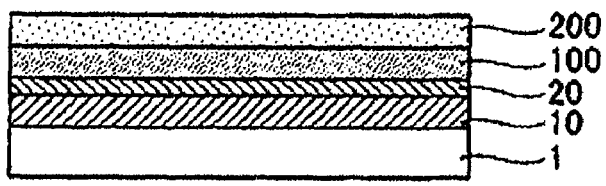

Thereafter, a chemically amplified high-sensitivity positive resist 200 (e.g., FEP171 produced by FUJIFILM Electronic Materials Co., Ltd.) for an electron beam may be applied on the middle layer 300 by using the spin-coating method and then pre-baked at a temperature of 130° C. for 10 minutes (FIG. 2B). A film thickness and sensitivity of the resist 200 may be 200 nm and 10 $\mu C/cm^2$, respectively.

In accordance with the described above, a halftone phase shift mask blank with a two-layered resist film may be fabricated.

Figure 2C:
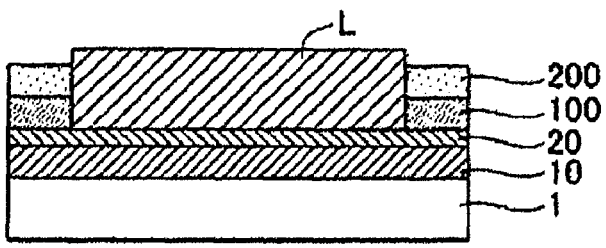

Next, by using an electron beam writing apparatus, writing may be performed using a low dose amount L (e.g., 10 $\mu C/cm^2$) suitable for sufficiently exposing the upper high-sensitivity positive resist 200 (resulting in a remaining rate of 0% by development) at the entire of the resist 200 except a light-shielding band forming area thereof (FIG. 2C).

In this way, the written portions (depicted as diagonal lines shown in FIG. 2C) of the upper high-sensitivity positive resist 200 may be removed by a subsequent developing.

Further, if additional writing is not performed during a subsequent process, the written portions (depicted as diagonal lines shown in FIG. 2C) of the lower low-sensitivity positive resist 100 may not be removed by a subsequent developing since the dose amount is insufficient.

Also, in the light-shielding band forming area, the upper high-sensitivity positive resist 200 and the lower low-sensitivity positive resist 100 may be still remained by a subsequent developing, if additional writing is not performed during a subsequent process.

Figure 2D:
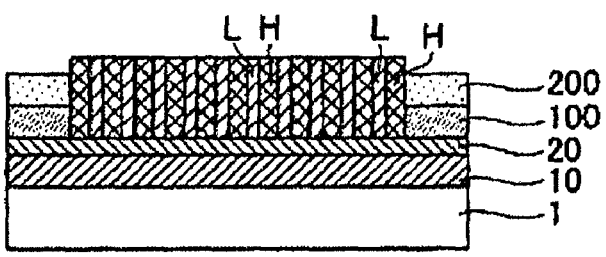

Subsequently, by using the electron beam writing apparatus, writing may be performed using a high dose amount H (e.g., 30 $\mu C/cm^2$) suitable for sufficiently exposing the lower low-sensitivity positive resist 100 (resulting in a remaining rate of 0% by development) and using a dose amount (e.g., 20 $\mu C/cm^2$) summed with the dose amount L of the previous process (FIG. 2D).

In this way, the written portions (depicted as crossed diagonal lines shown in FIG. 2D) of the lower low-sensitivity positive resist 100 may be removed by a subsequent developing. And, the written portions (depicted as crossed diagonal lines shown in FIG. 2D) of the upper high-sensitivity positive resist 200 were already removed by the previous process and also are to be removed by a subsequent developing.

Further, during this process, writing may be performed on the resist 100 by compensating the dose amount according to a pattern density in the electron beam writing apparatus, in order to obtain CD accuracy as defined in a design value to desired patterns (e.g., a line-and-space (L&S) of 200 nm, an isolated line (ISO LINE) of 200 nm, and an isolation space (ISO SPACE) of 200 nm). For example, the compensated dose amounts of the line-and-space, the isolated line, and the isolation space may be 20 $\mu C/cm^2$, 13 $\mu C/cm^2$, and 36 $\mu C/cm^2$, respectively.

Also, in the process shown in FIG. 2C, in case that writing is performed on the portions of the resist 100 except the written portions shown in FIG. 2D (depicted as crossed diagonal lines), i.e., the portions depicted as diagonal lines shown in FIG. 2D, a developing pattern same as the above pattern may be obtained. During this process, writing may be performed using the high dose amount H (e.g., 30 $\mu C/cm^2$) suitable for sufficiently exposing the lower low-sensitivity positive resist 100 (resulting in a remaining rate of 0% by development).

Figure 2E:
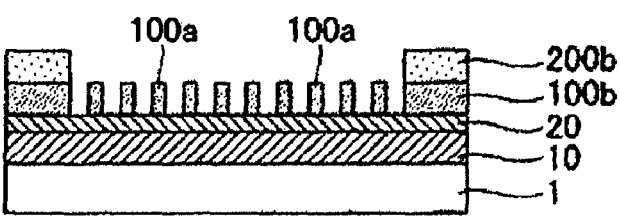

Thereafter, developing may be performed with a developer (e.g., TMAH) to form a resist pattern 100a in the light-shielding band forming area along with a resist pattern made of a laminated body which is comprised of resist patterns 100b and 200b (FIG. 2E).

During such developing, the middle layer 300 may be dissolved and removed by the developer.

Next, dry-etching may be performed on the light-shielding film 20 being exposed using the resist patterns 100a and 200b to form a light-shielding film pattern 20a and a light-shielding film pattern 20b, e.g., a light-shielding band pattern (FIG. 2E). The dry-etching may be performed by using a dry-etching gas such as a mixed gas of $Cl_2$ and $O_2$ ($Cl_2:O_2=4:1$).

During this dry-etching, the resist pattern 100a on the light-shielding film pattern 20a may be nearly removed. Also, the resist pattern 200b on the light-shielding band forming area may be nearly removed.

Figure 2F:
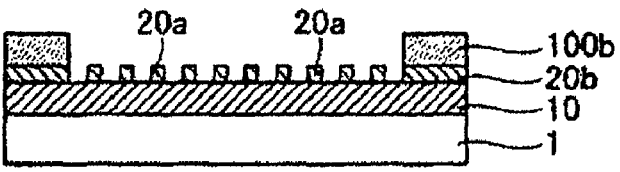
Figure 2G:
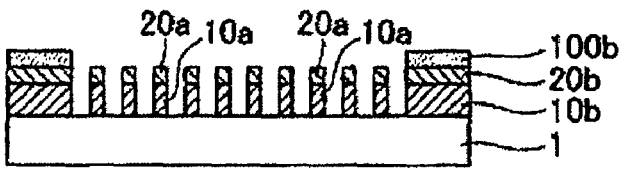
Figure 2H:
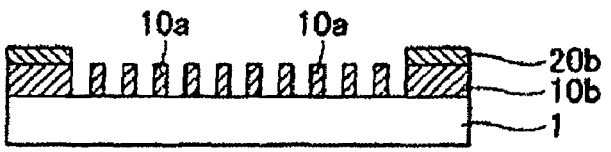

Subsequently, dry-etching may be further performed on the semi-transmitting film 10 being exposed using the light-shielding film pattern 20a to form a semi-transmitting film pattern 10a (FIG. 2F). The dry-etching may be performed by using a dry-etching gas such as a mixed gas of $SF_6$ and He.

In this way, the resist pattern 100b in the light-shielding band forming area may be about to be decreased by the dry-etching process, but left as much as a film thickness required for a subsequent process at the dry-etching termination time.

Next, the light-shielding film pattern 20a on the semi-transmitting film pattern 10a may be removed by dry-etching while the light-shielding film pattern 20b (e.g., the light-shielding band) may be protected with the resist pattern 100b in the light-shielding band forming area. The dry-etching may be performed by using a dry-etching gas such as a mixed gas of $Cl_2$ and $O_2$ ($Cl_2:O_2=4:1$).

During this dry-etching, the resist pattern 100b in the light-shielding band forming area may be removed.

Subsequently, cleaning may be performed on the resultant structure to fabricate a halftone phase shift mask for the ArF excimer laser. Such halftone phase shift mask may be provided with a light-shielding band made of a laminated body which is comprised of the light-shielding film pattern 20a and the semi-transmitting film pattern 10b in the light-shielding band forming area.

According to the process of Example 2, the desired patterns (the line-and-space of 200 nm, the isolated line of 200 nm, and the isolation space of 200 nm) may be obtained in the CD accuracy as defined in the design value for the semi-transmitting film pattern 10a.

Also, according to the process of Example 2, the resist pattern of a 3-dimensional step shown in FIG. 2E may be formed by performing the writings of FIGS. 2C and 2D and the etching at once, respectively. Consequently, it is possible to reduce the mask manufacturing process in comparison with a mask manufacturing process performing the writing and developing two times as well as to realize the decrease in a fabrication time and in cost. Further, according to the process of Example 2, it is possible to increase mask fabrication accuracy since the writing was performed at once only to thereby effectively prevent a writing position misalignment which may be induced by performing the applying, writing, developing, and stripping of a resist two times.

Moreover, according to the process of Example 2, since the resist pattern may not be remained so that it is not required to perform the stripping and removing of the resist pattern.

Also, in the process shown in FIGS. 2D and 2E, the relationship between "a nearly removing" of the resist patterns 200b and 100a and "a nearly remaining" of the resist pattern 100b may be derived from same film thicknesses and same dry-etching rates of the resist 100 and the resist 200. Although the resist patterns 200b and 100a were remained in a small amount, it is not a critical problem because the residual resist patterns 200b and 100a may be securely removed by a subsequent dry-etching. Even though the resist pattern 100b was over-etched, it is not a critical problem as long as the resist pattern 100b can be remained to a film thickness required for a subsequent process at the dry-etching termination time during the process shown in FIG. 2G.

Also, according to Example 2, it is difficult to perform the writing by compensating the dose amount according to the pattern density in the electron beam writing apparatus if the range "a" shown in FIG. 7 is narrow (i.e., the sensitivity difference between the upper and lower resists is small) or the range "c" is superposed with the range "a." As a result, it is nearly impossible or difficult to obtain the desired patterns (e.g., the line-and-space of 200 nm, the isolated line of 200 nm, and the isolation space of 200 nm) in the CD accuracy as defined in the design value for the semi-transmitting film pattern 10a.

Further, according to Example 2, in case that the dissolution rate of the middle layer 300 against the developer is large, or the film thickness of the middle layer 300 is thick, a portion of the resist 200 whose the resist pattern 200b in the light-shielding band forming area is to be formed may be partially or entirely removed along with the middle layer 300 underneath the portion.

REFERENCE EXAMPLE 1

With reference to Examples 1 and 2, Reference Example 1 is performed under the same conditions as that in Example 1 except that sensitivity of the resist 200 is below 20 $\mu C/cm^2$ (e.g., 14 $\mu C/cm^2$).

According to Reference Example 1, it is difficult to perform the writing by compensating the dose amount according to the pattern density in the electron beam writing apparatus, in order to obtain the desired patterns (e.g., the line-and-space of 200 nm, the isolated line of 200 nm, and the isolation space of 200 nm) in the CD accuracy as defined in the design value for the semi-transmitting film pattern 10a.

REFERENCE EXAMPLE 2

In case that the water-soluble organic film in the current market as the middle layer 300 was applied under the same conditions as that in Examples 1 and 2, it is difficult to form the thin film of below 50 nm because the water-soluble organic film was splashed to the resist 100 to form an island shape (e.g., a waterdrop shape). That is, it occurs a portion whose a film is not formed or a thickness becomes extremely thin. This is the reason why the up-to-date chemically amplified resist for an electron beam has hydrophobicity.

REFERENCE EXAMPLE 3

In Examples 1 and 2, if a thickness of the middle layer 300 is over 50 nm (e.g., 58 nm), a portion of the resist 100 whose the resist pattern of the isolated line of 200 nm is to be formed may be removed along with the middle layer 300 underneath the portion during the developing.

This is the reason why the film thickness of the middle layer 300 is large so that the developer may be easily chemisorbed into the middle layer 300, to thereby remove the middle layer 300 from the portion whose the fine pattern is formed.

EXAMPLE 3

Figure 3A:
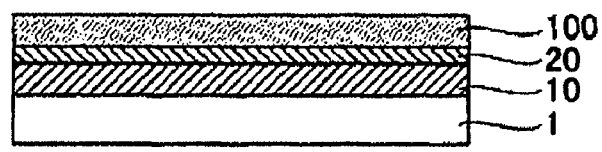
FIGS. 3A to 3H are illustrative sectional views showing a transfer mask manufacturing process by using a mask blank in accordance with Example 3 of the present disclosure.

As shown in FIG. 3A, a semi-transmitting film 10 (e.g., a MoSiN film) may be formed on a transparent substrate 1 under the same conditions as that in Example 1. The semi-transmitting film 10 may be made of molybdenum nitride and silicon same as in Example 1 and the transparent substrate 1 may be the same as in Example 1.

Next, a light-shielding film 20 may be formed on the semi-transmitting film 10 under the same conditions as that in Example 1 (FIG. 3A). The light-shielding film 20 may be made of a back-surface antireflection layer, a light-shielding layer, and a front-surface antireflection layer, which are the same as in Example 1.

Subsequently, a chemically amplified low-sensitivity positive resist 100 (e.g., PRL009 produced by FUJIFILM Electronic Materials Co., Ltd.) for an electron beam may be applied on the light-shielding film 20 by using a spin-coating method and then pre-baked at a temperature of 130° C. for 10 minutes (FIG. 3A). A film thickness and sensitivity of the resist 100 may be 200 nm and 30 $\mu C/cm^2$, respectively.

And then, a middle layer 300 shown in FIG. 11 may be uniformly applied on the entire surface of the resist 100 by using the spin-coating method to a thickness of below 50 nm (e.g., 30 nm).

As the middle layer 300, a water-soluble organic film, preferably, a water-soluble antireflection film, (e.g., AQUATER produced by AZ Electronic Materials Co., Ltd.) may be used.

Figure 3B:
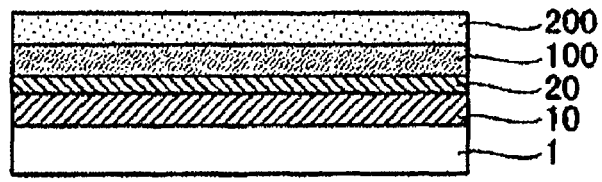

Thereafter, a chemically amplified high-sensitivity negative resist 200 (e.g., FEN270 produced by FUJIFILM Electronic Materials Co., Ltd.) for an electron beam may be applied on the middle layer 300 by using the spin-coating method and then pre-baked at a temperature of 130° C. for 10 minutes (FIG. 3B). A film thickness and sensitivity of the resist 200 may be 200 nm and 10 $\mu C/cm^2$, respectively.

In accordance with the described above, a halftone phase shift mask blank with a two-layered resist film may be fabricated.

Figure 3C:
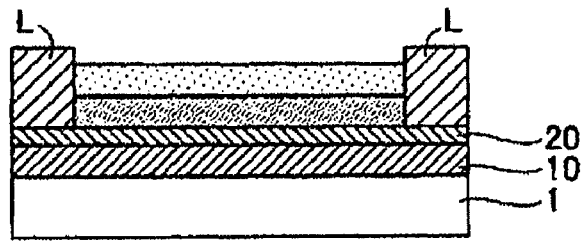

Next, by using an electron beam writing apparatus, writing may be performed using a low dose amount L (e.g., 10 $\mu C/cm^2$) suitable for sufficiently exposing the upper high-sensitivity negative resist 200 (resulting in a remaining rate of about 100% by development) in a light-shielding band forming area (FIG. 3C).

In this way, the written portions (depicted as diagonal lines shown in FIG. 3C) of the upper high-sensitivity negative resist 200 may not be removed by a subsequent developing. Further, if additional writing is not performed in a subsequent process, the written portions (depicted as diagonal lines shown in FIG. 3C) of the lower low-sensitivity positive resist 100 may not be removed by a subsequent developing since the dose amount is insufficient.

Figure 3D:
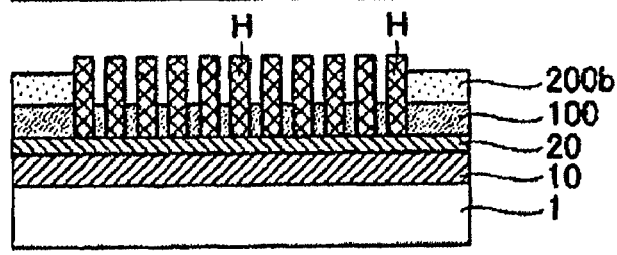

Thereafter, developing may be performed with a developer (e.g., TMAH) to remove the upper high-sensitivity negative resist 200 from an area except the light-shielding band forming area as well as to form a resist pattern 200b in a light-shielding band forming area (FIG. 3D).

Subsequently, by using the electron beam writing apparatus, writing may be performed using a high dose amount H (e.g., 30 μC/cm$^2$) suitable for sufficiently exposing the lower low-sensitivity positive resist 100 (resulting in a remaining rate of 0% by development) in an area except the light-shielding band forming area (FIG. 3D).

In this way, the written portions (depicted as crossed diagonal lines shown in FIG. 3D) of the lower low-sensitivity positive resist 100 may be removed by a subsequent developing.

During this process, the writing may be performed on the resist 100 by compensating the dose amount according to a pattern density in the electron beam writing apparatus, in order to obtain CD accuracy as defined in a design value for desired patterns (e.g., a line-and-space (L&S) of 200 nm, an isolated line (ISO LINE) of 200 nm, and an isolation space (ISO SPACE) of 200 nm). For example, the compensated dose amounts of the line-and-space, the isolated line, and the isolation space may be 30 μC/cm$^2$, 26 μC/cm$^2$, and 46 μC/cm$^2$, respectively.

Also, in accordance with Example 3, the sequence order of writings using the low dose amount L and the high dose amount H may be reversible.

Figure 3E:
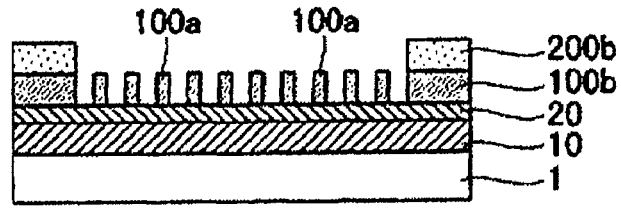

Thereafter, developing may be performed with a developer (e.g., TMAH) to form a resist pattern 100a along with a resist pattern made of a laminated body which is comprised of resist patterns 100b and 200b in the light-shielding band forming area (FIG. 3E).

During such developing, the middle layer 300 may be dissolved and removed by the developer.

Figure 3F:
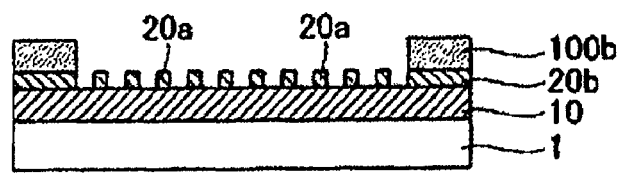

Next, dry-etching may be performed on the light-shielding film 20 being exposed using the resist patterns 100a and 200b to form a light-shielding film pattern 20a and a light-shielding film pattern 20b, e.g., a light-shielding band pattern (FIG. 3F). The dry-etching may be performed by using a dry-etching gas such as a mixed gas of Cl$_2$ and O$_2$ (Cl$_2$:O$_2$=4:1).

During this dry-etching, the resist pattern 100a on the light-shielding film pattern 20a may be nearly removed. Also, the resist pattern 200b in the light-shielding band forming area may be nearly removed.

Figure 3G:
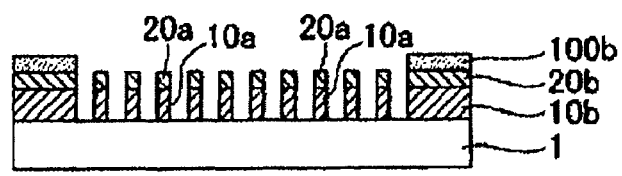

Subsequently, dry-etching may be further performed on the semi-transmitting film 10 being exposed using the light-shielding film pattern 20a to form a semi-transmitting film pattern 10a (FIG. 3G). The dry-etching may be performed by using a dry-etching gas such as a mixed gas of SF$_6$ and He.

During this process, the resist pattern 100b in the light-shielding band forming area may be about to be decreased, but left as much as a film thickness required for a subsequent process at the dry-etching termination time.

Figure 3H:
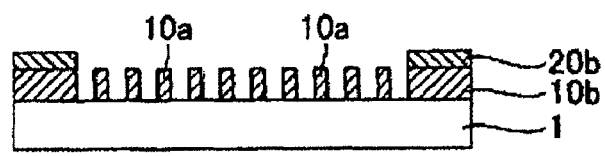

Next, the light-shielding film pattern 20a on the semi-transmitting film pattern 10a may be removed by dry-etching while the light-shielding film pattern 20b (e.g., the light-shielding band) may be protected with the resist pattern 100b in the light-shielding band forming area (FIG. 3H). The dry-etching may be performed by using a dry-etching gas such as a mixed gas of Cl$_2$ and O$_2$ (Cl$_2$:O$_2$=4:1).

During such dry-etching, the resist pattern 100b in the light-shielding band forming area may be removed.

Subsequently, cleaning may be performed on the resultant structure to fabricate a halftone phase shift mask for the ArF excimer laser. Such halftone phase shift mask may be provided with the light-shielding band made of a laminated body which is comprised of the light-shielding film pattern 20a and the semi-transmitting film pattern 10b in the light-shielding band forming area.

According to the above process of Example 3, the desired patterns (e.g., the line-and-space of 200 nm, the isolated line of 200 nm, and the isolation space of 200 nm) may be obtained in the CD accuracy as defined in the design value with respect to the semi-transmitting film pattern 10a.

Also, according to the above process of Example 3, the resist pattern of a 3-dimensional step shown in FIG. 3E may be formed by performing the continuous writing of FIGS. 3C and 3D at once and the etching two times. Therefore, it is possible to reduce the mask manufacturing process in comparison with a mask manufacturing process performing the writing and developing two times as well as to realize the decrease in a fabrication time and in cost. Further, according to the above process of Example 3, it is possible to increase mask fabrication accuracy since the writing was performed at once to thereby effectively prevent a writing position misalignment which may be induced by performing the applying, writing, developing, and stripping of a resist two times.

Moreover, according to the above process of Example 3, since the resist pattern may not remained so that it is not required to perform the stripping and removing of the resist pattern.

Also, in the above process shown in FIGS. 3D and 3E, the relationship between "a nearly removing" of the resist patterns 200b and 100a and "a nearly remaining" of the resist pattern 100b may be derived from same film thicknesses and same dry-etching rates of the resist 100 and the resist 200. Although the resist patterns 200b and 100a were remained in a small amount, it is not a critical problem because the residual resist patterns 200b and 100a may be securely removed by a subsequent dry-etching. Even though the resist pattern 100b was over-etched, it is not a critical problem as long as the resist pattern 100b can be remained to a film thickness required for a subsequent process at the dry-etching termination time during the process shown in FIG. 3G.

According to Example 3, if the range "a" shown in FIG. 9 is narrow (i.e., the sensitivity difference between the upper and lower resists is small), or the range "c" is superposed with the range "a," it is nearly impossible or difficult to obtain the desired patterns (e.g., the line-and-space of 200 nm, the isolated line of 200 nm, and the isolation space of 200 nm) in the CD accuracy as defined in the design value with respect to the semi-transmitting film pattern 10a.

Further, according to Example 3, in case that the dissolution rate of the middle layer 300 against the developer is large or a film thickness of the middle layer 300 is thick, a portion of the resist 200 whose the resist pattern 200b of the light-shielding band forming area is to be formed may be partially or entirely removed along with the middle layer 300 underneath the portion.

EXAMPLE 4

Figure 4A:
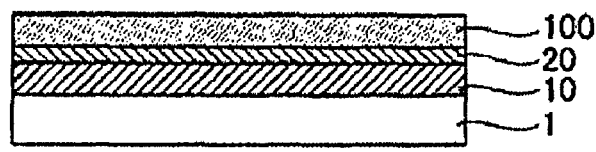
FIGS. 4A to 4G are illustrative sectional views showing a transfer mask manufacturing process by using a mask blank in accordance with Example 4 of the present disclosure.

As shown in FIG. 4A, a semi-transmitting film 10 (e.g., a MoSiN film) may be formed on a transparent substrate 1 under the same conditions as that in Example 1. The semi-transmitting film 10 may be made of molybdenum nitride and silicon same as in Example 1 and the transparent substrate 1 may be the same as in Example 1.

Next, a light-shielding film 20 may be formed on the semi-transmitting film 10 under the same conditions as that in Example 1 (FIG. 4A). The light-shielding film 20 may be made of a back-surface antireflection layer, a light-shielding layer, and a front-surface antireflection layer, which are the same as in Example 1.

Subsequently, a chemically amplified high-sensitivity negative resist 100 (e.g., FEN270 produced by FUJIFILM Electronic Materials Co., Ltd.) for an electron beam may be applied on the light-shielding film 20 by using a spin-coating method and then pre-baked at a temperature of 130° C. for 10 minutes (FIG. 1A). A film thickness and sensitivity of the resist 100 may be 200 nm and 10 μC/cm$^2$, respectively.

And then, a middle layer 300 shown in FIG. 11 may be uniformly applied on the entire surface of the resist 100 by using the spin-coating method to a thickness of below 50 nm (e.g., 30 nm).

As the middle layer 300, a water-soluble organic film, preferably, a water-soluble antireflection film, (e.g., AQUATER produced by AZ Electronic Materials Co., Ltd.) may be used.

Figure 4B:
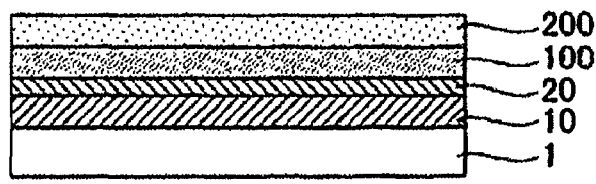

Thereafter, a chemically amplified low-sensitivity negative resist 200 (e.g., SLV12M produced by FUJIFILM Electronic Materials Co., Ltd.) for an electron beam may be applied on the middle layer 300 by using the spin-coating method and then pre-baked at a temperature of 120 to 130° C. for 10 minutes (FIG. 4B). A film thickness and sensitivity of the resist 200 may be 200 nm and 20 μC/cm$^2$, respectively.

In accordance with the described above, a tri-tone phase shift mask blank with a two-layered resist film may be fabricated.

Figure 4C:
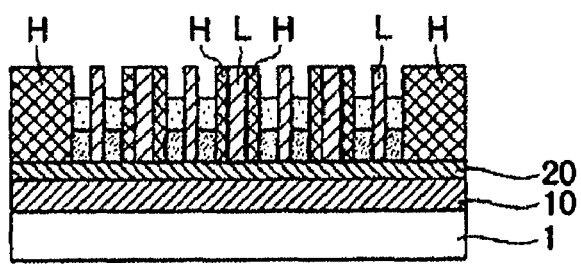

Next, by using an electron beam writing apparatus, writing may be performed using a low dose amount L (e.g., 10 μC/cm$^2$) suitable for sufficiently exposing the lower high-sensitivity negative resist 100 (resulting in a remaining rate of about 100% by development) in an area except a light-shielding band forming area (FIG. 4C).

In this way, the written portions (depicted as diagonal lines shown in FIG. 4C) of the lower high-sensitivity negative resist 100 may not be removed by a subsequent developing.

Further, the written portions (depicted as diagonal lines shown in FIG. 4C) of the upper low-sensitivity negative resist 200 may not be removed by a subsequent developing since the dose amount is insufficient.

Moreover, during such process, writing may be performed on the resist 100 by compensating the dose amount according to a pattern density in the electron beam writing apparatus, in order to obtain CD accuracy as defined in a design value for desired patterns (e.g., a line-and-space (L&S) of 200 nm, an isolated line (ISO LINE) of 200 nm, and an isolation space (ISO SPACE) of 200 nm). For example, the compensated dose amounts of the line-and-space, the isolated line, and the isolation space may be 10 μC/cm$^2$, 16 μC/cm$^2$, and 8 μC/cm$^2$, respectively.

Subsequently, by using the electron beam writing apparatus, writing may be further performed using a high dose amount H (e.g., 20 μC/cm$^2$) suitable for exposing the upper low-sensitivity negative resist 200 in the light-shielding band forming area and the area except the light-shielding band forming area (FIG. 4C).

In this way, the written portions (depicted as crossed diagonal lines shown in FIG. 4C) of the upper low-sensitivity negative resist 200 may not be removed by a subsequent developing. And, the written portions (depicted as crossed diagonal lines shown in FIG. 4C) of the lower high-sensitivity negative resist 100 may not be removed by a subsequent developing.

Further, during such process, writing may be performed on the resist 200 by compensating the dose amount according to the pattern density in the electron beam writing apparatus, in order to obtain CD accuracy as defined in a design value for desired patterns (e.g., a line-and-space (L&S) of 200 nm, an isolated line (ISO LINE) of 200 nm, and an isolation space (ISO SPACE) of 200 nm). For example, the compensated dose amounts of the line-and-space, the isolated line, and the isolation space may be 20 μC/cm$^2$, 36 μC/cm$^2$, and 13 μC/cm$^2$, respectively.

Also, in accordance with Example 4, the sequence order of the writings using the low dose amount L and the high dose amount H may be reversible.

Figure 4D:
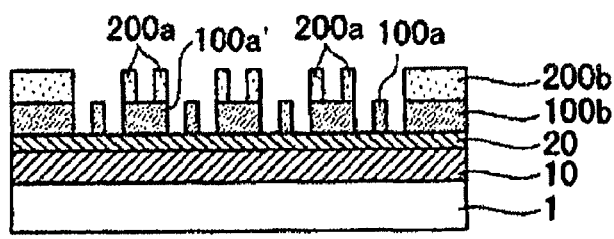

Thereafter, developing may be performed with a developer (e.g., TMAH) to form resist patterns 100a and 100a' and a resist pattern 200a along with a resist pattern made of a laminated body which is comprised of a resist pattern 100b and a resist pattern 200b in the light-shielding band forming area (FIG. 4D).

During such developing, the middle layer 300 may be dissolved and removed by the developer.

Figure 4E:
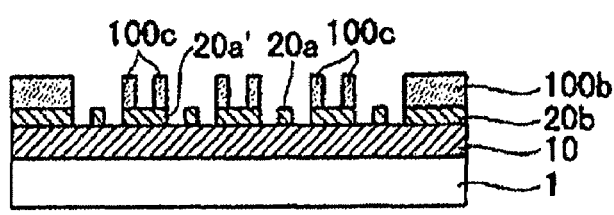

Next, dry-etching may be performed on the light-shielding film 20 being exposed using the resist patterns 100a, 100a', and 200b to form light-shielding film patterns 20a and 20a' and a light-shielding film pattern 20b, e.g., a light-shielding band pattern (FIG. 4E). The dry-etching may be performed by using a dry-etching gas such as a mixed gas of $Cl_2$ and $O_2$ ($Cl_2$:$O_2$=4:1).

During such dry-etching, the resist pattern 100a on the light-shielding film pattern 20a may be nearly removed.

Further, on the light-shielding film pattern 20a', the resist pattern 100a' not underneath the resist pattern 200a may be nearly removed by the dry-etching while the remaining underneath the resist pattern 200a may be fully remained. Consequently, a resist pattern 100c may be formed on the light-shielding film pattern 20a'.

During this process, the resist pattern 200b in the light-shielding band forming area may be nearly removed by the dry-etching.

Figure 4F:
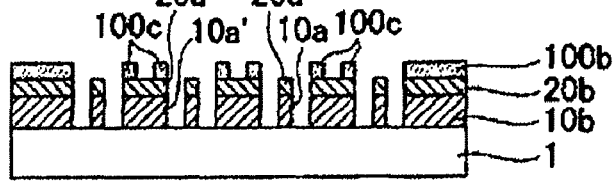

Subsequently, dry-etching may be performed on the semi-transmitting film 10 being exposed using the light-shielding film patterns 20a and 20a' to form semi-transmitting film patterns 10a and 10a' (FIG. 4F). The dry-etching may be performed by using a dry-etching gas such as a mixed gas of $SF_6$ and He.

During such dry-etching, the resist pattern 100c on the light-shielding film pattern 20a' and the resist pattern 100b in the light-shielding band forming area may be about to be decreased, but left as much as a film thickness required for a subsequent process at the dry-etching termination time.

Figure 4G:
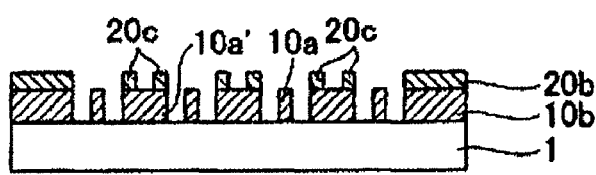

Next, dry-etching may be performed on the light-shielding film pattern 20a' using the resist pattern 100c to form a light-shielding film pattern 20c, e.g., a patch (FIG. 4G). Concurrently, the light-shielding film pattern 20a on the semi-transmitting film pattern 10a may be removed by dry-etching while the light-shielding film pattern 20b (e.g., the light-shielding band) may be protected with the resist pattern 100b in the light-shielding band forming area (FIG. 4G). The dry-etching may be performed by using a dry-etching gas such as a mixed gas of $Cl_2$ and $O_2$ ($Cl_2$:$O_2$=4:1).

During such process, the resist pattern 100c on the light-shielding film pattern 20a' and the resist pattern 100b in the light-shielding band forming area may be removed.

Subsequently, cleaning may be performed on the resultant structure to fabricate a tri-tone phase shift mask for the ArF excimer laser. Such tri-tone phase shift mask may be provided with the light-shielding film 20c (e.g., the patch) on the semi-transmitting film pattern 10a' and the light-shielding band made of a laminated body which is comprised of the light-shielding film pattern 20b and the semi-transmitting film pattern 10b in the light-shielding band forming area.

According to the above process of Example 4, the desired patterns (e.g., the line-and-space of 200 nm, the isolated line of 200 nm, and the isolation space of 200 nm) may be obtained in the CD accuracy as defined in the design value with respect to the semi-transmitting film patterns 10a and 10a' and the light-shielding film pattern 20c (e.g., the patch).

Also, a portion of the resist 200 whose the resist pattern of the isolated line of 200 nm is to be formed may not be removed along with the middle layer 300 underneath the portion.

Moreover, according to the above process of Example 4, the resist pattern of a 3-dimensional step shown in FIG. 4D may be formed by performing the writing of FIG. 4C at once and the developing at once. Therefore, it is possible to reduce the mask manufacturing process in comparison with a mask manufacturing process performing the writing and developing two times, to thereby realize the decrease in a fabrication time and in cost. Further, according to the above process of Example 4, it is possible to increase mask fabrication accuracy since the writing was performed at once only to effectively prevent a writing position misalignment which may be induced by performing the applying, writing, developing, and stripping of a resist two times.

Further, according to the above process of Example 4, since the resist pattern may not be remained so that it is not required to perform the stripping and removing of the resist pattern.

Also, in the above process shown in FIGS. 4D and 4E, the relationship between "a nearly removing" of the resist patterns 200a, 200b and 100a and "a nearly remaining" of the resist patterns 100c (e.g., some of 100a') and 100b may be derived from same film thicknesses and same dry-etching rates of the resist 100 and the resist 200. Although the resist patterns 200a, 200b and 100a were remained in a small amount, it is not a critical problem because the residual resist patterns 200a, 200b and 100a may be clearly removed by a subsequent dry-etching. Even though the resist patterns 100c (e.g., some of 100a') and 100b were over-etched, it is not a critical problem as long as the resist patterns 100c (e.g., some of 100a') and 100b can be remained to film thicknesses required for a subsequent process at the dry-etching termination time during the process shown in FIG. 4F.

EXAMPLE 5

Figure 5A:
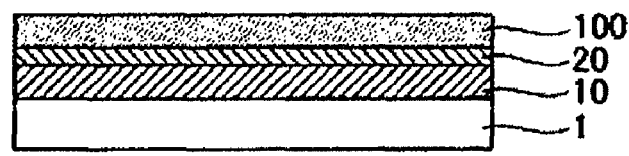
FIGS. 5A to 5G are illustrative sectional views showing a transfer mask manufacturing process by using a mask blank in accordance with Example 5 of the present disclosure.

As shown in FIG. 5A, a semi-transmitting film 10 (e.g., a MoSiN film) may be formed on a transparent substrate 1 under the same conditions as that in Example 1. The semi-transmitting film 10 may be made of molybdenum nitride and silicon same as in Example 1 and the transparent substrate 1 may be the same as in Example 1.

Next, a light-shielding film 20 may be formed on the semi-transmitting film 10 under the same conditions as in Example 1 (FIG. 5A). The light-shielding film 20 may be made of a back-surface antireflection layer, a light-shielding layer, and a front-surface antireflection layer, which are the same as in Example 1.

Subsequently, a chemically amplified low-sensitivity positive resist 100 (e.g., PRL009 produced by FUJIFILM Electronic Materials Co., Ltd.) for an electron beam may be applied on the light-shielding film 20 by using a spin-coating method and then pre-baked at a temperature of 130° C. for 10 minutes (FIG. 5A). A film thickness and sensitivity of the resist 100 may be 200 nm and 30 $\mu C/cm^2$, respectively.

And then, a middle layer 300 shown in FIG. 11 may be uniformly applied on the entire surface of the resist 100 by using the spin-coating method to a thickness of below 50 nm (e.g., 30 nm).

As the middle layer 300, a water-soluble organic film, preferably, a water-soluble antireflection film, (e.g., AQUATER produced by AZ Electronic Materials Co., Ltd.) may be used.

Figure 5B:
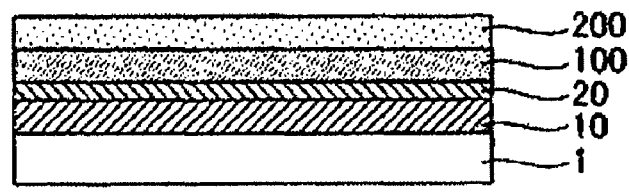

Thereafter, a chemically amplified high-sensitivity positive resist 200 (e.g., FEP171 produced by FUJIFILM Electronic Materials Co., Ltd.) for an electron beam may be applied on the middle layer 300 by using the spin-coating method and then pre-baked at a temperature of 130° C. for 10 minutes (FIG. 5B). A film thickness and sensitivity of the resist 200 may be 200 nm and 10 $\mu C/cm^2$, respectively.

In accordance with the described above, a tri-tone phase shift mask blank with a two-layered resist film may be fabricated.

Figure 5C:
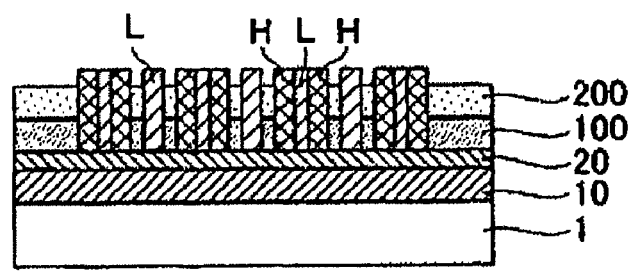

Next, by using an electron beam writing apparatus, writing may be performed using a low dose amount L (e.g., 10 $\mu C/cm^2$) suitable for sufficiently exposing the upper high-sensitivity positive resist 200 (resulting in a remaining rate of 0% by development) in an area except a light-shielding band forming area (FIG. 5C).

In this way, the written portions (depicted as diagonal lines shown in FIG. 5C) of the upper high-sensitivity positive resist 200 may be removed by a subsequent developing.

Further, if additional writing is not performed by a subsequent process, the written portions (depicted as diagonal lines shown in FIG. 5C) of the lower low-sensitivity positive resist 100 may not be removed by a subsequent developing since the dose amount is insufficient.

Also, in the light-shielding band forming area, the upper high-sensitivity positive resist 200 and the lower low-sensitivity positive resist 100 may be remained by a subsequent developing, if additional writing is not performed in a subsequent process.

Moreover, during such process, writing may be performed on the resist 200 by compensating the dose amount according to a pattern density in the electron beam writing apparatus, in order to obtain CD accuracy as defined in a design value for desired patterns (e.g., a line-and-space (L&S) of 200 nm, an isolated line (ISO LINE) of 200 nm, and an isolation space (ISO SPACE) of 200 nm). For example, the compensated dose amounts of the line-and-space, the isolated line, and the isolation space may be 10 $\mu C/cm^2$, 8 $\mu C/cm^2$, and 16 $\mu C/cm^2$, respectively.

Subsequently, by using the electron beam writing apparatus, writing may be further performed using a high dose amount H (e.g., 30 $\mu C/cm^2$) suitable for sufficiently exposing the lower low-sensitivity positive resist 100 in the area except the light-shielding band forming area (FIG. 5C).

At this time, the written portions (depicted as crossed diagonal lines shown in FIG. 5C) of the lower low-sensitivity positive resist 100 may be removed by a subsequent developing. And, the written portions (depicted as crossed diagonal lines shown in FIG. 5C) of the upper high-sensitivity positive resist 200 may be removed by a subsequent developing.

Further, during such process, writing may be performed on the resist 100 by compensating the dose amount according to the pattern density in the electron beam writing apparatus, in order to obtain CD accuracy as defined in a design value for desired patterns (e.g., a line-and-space (L&S) of 200 nm, an isolated line (ISO LINE) of 200 nm, and an isolation space (ISO SPACE) of 200 nm). For example, the compensated dose amounts of the line-and-space, the isolated line, and the isolation space may be 30 $\mu C/cm^2$, 23 $\mu C/cm^2$, and 46 $\mu C/cm^2$, respectively.

Figure 5D:
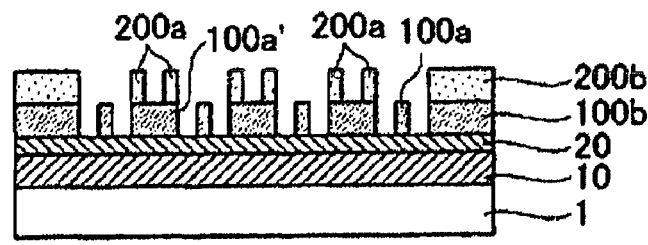

Thereafter, developing may be performed on the resultant structure with a developer (e.g., TMAH) to form resist patterns 100a and 100a' and a resist pattern 200a along with a resist pattern made of a laminated body which is comprised of a resist pattern 100b and a resist pattern 200b in the light-shielding band forming area (FIG. 5D).

During such developing, the middle layer 300 may be dissolved and removed by the developer.

Figure 5E:
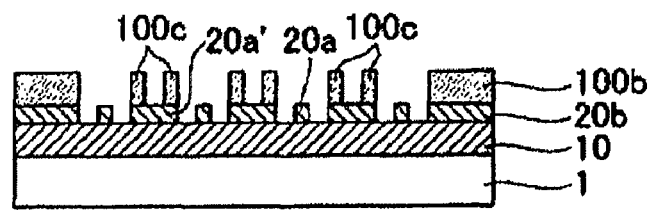

Next, dry-etching may be performed on the light-shielding film 20 being exposed using the resist patterns 100a, 100a', and 200b to form light-shielding film patterns 20a and 20a' and a light-shielding film pattern 20b, e.g., a light-shielding band pattern (FIG. 5E). The dry-etching may be performed by using a dry-etching gas such as a mixed gas of $Cl_2$ and $O_2$ ($Cl_2:O_2=4:1$).

During such dry-etching, the resist pattern 100a on the light-shielding film pattern 20a may be nearly removed.

Further, on the light-shielding film pattern 20a', the resist pattern 100a' not underneath the resist pattern 200a may be nearly removed by the dry-etching while the remaining underneath the resist pattern 200a may be fully remained. As such, a resist pattern 100c may be formed on the light-shielding film pattern 20a'.

Also, the resist pattern 200b in the light-shielding band forming area may be nearly removed by the dry-etching.

Figure 5F:
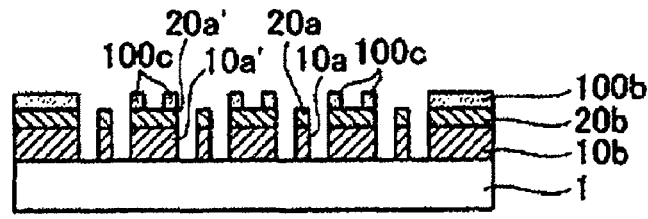

Subsequently, dry-etching may be further performed on the semi-transmitting film 10 being exposed using the light-shielding film patterns 20a and 20a' to form semi-transmitting film patterns 10a and 10a' (FIG. 5F). The dry-etching may be performed by using a dry-etching gas such as a mixed gas of $SF_6$ and He.

During this process, the resist pattern 100c on the light-shielding film pattern 20a' and the resist pattern 100b in the light-shielding band forming area may be about to be decreased, but left as much as film thicknesses required for a subsequent process at the dry-etching termination time.

Figure 5G:
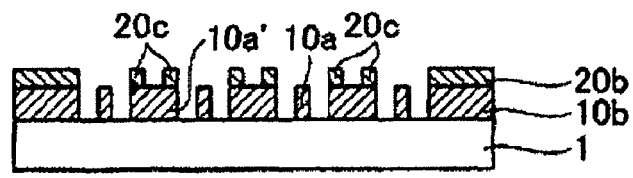

Next, dry-etching may also be performed on the light-shielding film pattern 20a' being exposed using the resist pattern 100c to form a light-shielding film pattern 20c, e.g., a patch (FIG. 5G). Concurrently, the light-shielding film pattern 20a on the semi-transmitting film pattern 10a may be removed by the dry-etching while the light-shielding film pattern 20b (e.g., the light-shielding band) may be protected with the resist pattern 100b in the light-shielding band forming area (FIG. 5G). The dry-etching may be performed by using a dry-etching gas such as a mixed gas of $Cl_2$ and $O_2$ ($Cl_2:O_2=4:1$).

During such dry-etching, the resist pattern 100c on the light-shielding film pattern 20a' and the resist pattern 100b in the light-shielding band forming area may be removed.

Subsequently, cleaning may be performed on the resultant structure to fabricate a tri-tone phase shift mask for the ArF excimer laser. Such tri-tone phase shift mask may be provided with the light-shielding film 20c (e.g., the patch) on the semi-transmitting film pattern 10a' and the light-shielding band made of a laminated body which is comprised of the light-shielding film pattern 20b and the semi-transmitting film pattern 10b in the light-shielding band forming area.

According to the above process of Example 5, the desired patterns (e.g., the line-and-space of 200 nm, the isolated line of 200 nm, and the isolation space of 200 nm) may be obtained in the CD accuracy as defined in the design value with respect to the semi-transmitting film patterns 10a and 10a' and the light-shielding film pattern 20c (e.g., the patch).

Also, a portion of the resist 200 whose the resist pattern of the isolated line of 200 nm is to be formed may not be removed along with the middle layer 300 underneath the portion.

Moreover, according to the above process of Example 5, the resist pattern of a 3-dimensional step shown in FIG. 5D may be formed by performing the writing of FIG. 5C at once and the developing at once. Therefore, it is possible to reduce the mask manufacturing process in comparison with a mask manufacturing process performing the writing, developing, and stripping two times, to thereby realize the decrease in a fabrication time and in cost. Further, according to the above process of Example 5, it is possible to increase mask fabrication accuracy since the writing was performed at once only to effectively prevent a writing position misalignment which may be induced by performing the applying, writing, developing, and stripping of a resist two times.

Further, according to the above process of Example 5, since the resist pattern may not be remained so that it is not required to perform the stripping and removing of the resist pattern.

Also, in the above process shown in FIGS. 5D and 5E, the relationship between "a nearly removing" of the resist patterns 200a, 200b and 100a and "a nearly remaining" of the resist patterns 100c (e.g., some of 100a') and 100b may be derived from same film thicknesses and same dry-etching rates of the resist 100 and the resist 200. Although the resist patterns 200a, 200b and 100a were remained in small amounts, it is not a critical problem because the resist patterns 200a, 200b and 100a can be securely removed in a subsequent dry-etching. Even though the resist patterns 100c (e.g., some of 100a') and 100b were over-etched, it is not a critical problem as long as the resist patterns 100c (e.g., some of 100a') and 100b can be remained to film thicknesses required for a subsequent process at the dry-etching termination time during the process shown in FIG. 5F.

EXAMPLE 6

Figure 6A:
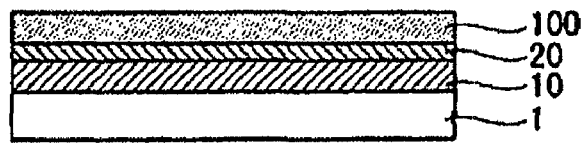
FIGS. 6A to 6H are illustrative sectional views showing a transfer mask manufacturing process by using a mask blank in accordance with Example 6 of the present disclosure.

As shown in FIG. 6A, a semi-transmitting film 10 (e.g., a MoSiN film) may be formed on a transparent substrate 1 under the same conditions as that in Example 1. The semi-transmitting film 10 may be made of molybdenum nitride and silicon same as in Example 1 and the transparent substrate 1 may be the same as in Example 1.

Next, a light-shielding film 20 may be formed on the semi-transmitting film 10 under the same conditions as that in Example 1 (FIG. 6A). The light-shielding film 20 may be made of a back-surface antireflection layer, a light-shielding layer, and a front-surface antireflection layer, which are the same as in Example 1.

Subsequently, a chemically amplified low-sensitivity positive resist 100 (e.g., PRL009 produced by FUJIFILM Electronic Materials Co., Ltd.) for an electron beam may be applied on the light-shielding film 20 by using a spin-coating method and then pre-baked at a temperature of 130° C. for 10 minutes (FIG. 6A). A film thickness and sensitivity of the resist 100 may be 200 nm and 30 $\mu C/cm^2$, respectively.

And then, a middle layer 300 shown in FIG. 11 may be uniformly applied on the entire surface of the resist 100 by using the spin-coating method to a thickness of below 50 nm (e.g., 30 nm).

As the middle layer 300, a water-soluble organic film, preferably, a water-soluble antireflection film, (e.g., AQUATER produced by AZ Electronic Materials Co., Ltd.) may be used.

Figure 6B:
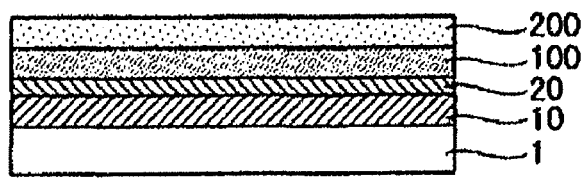

Thereafter, a chemically amplified high-sensitivity negative resist 200 (e.g., FEN270 produced by FUJIFILM Electronic Materials Co., Ltd.) for an electron beam may be applied on the middle layer 300 by using the spin-coating method and then pre-baked at a temperature of 130° C. for 10 minutes (FIG. 6B). A film thickness and sensitivity of the resist 200 may be 200 nm and 10 $\mu C/cm^2$, respectively.

In accordance with the described above, a tri-tone phase shift mask blank with a two-layered resist film may be fabricated.

Figure 6C:
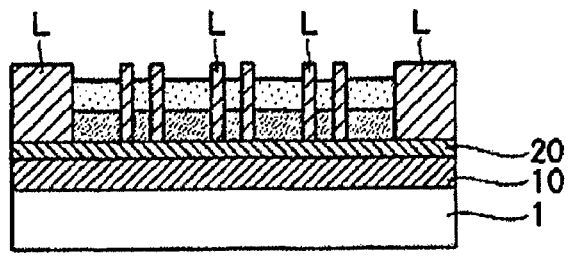

Next, by using the electron beam writing apparatus, writing may be performed using a low dose amount L (e.g., 10 $\mu C/cm^2$) suitable for exposing the upper high-sensitivity negative resist 200 in a light-shielding band forming area and an area except the light-shielding band forming area (FIG. 6C).

In this way, the written portions (depicted as diagonal lines shown in FIG. 6C) of the upper high-sensitivity negative resist 200 may not be removed by a subsequent developing. If additional writing is not performed by a subsequent process, the written portions (depicted as diagonal lines shown in FIG. 6C) of the lower low-sensitivity positive resist 100 may not be removed by a subsequent developing since the dose amount is insufficient.

Also, during such process, writing may be performed on the resist 200 by compensating the dose amount according to a pattern density in the electron beam writing apparatus, in order to obtain CD accuracy as defined in a design value for desired patterns (a line-and-space (L&S) of 200 nm, an isolated line (ISO LINE) of 200 nm, and an isolation space (ISO SPACE) of 200 nm). For example, the compensated dose amounts of the line-and-space, the isolated line, and the isolation space may be 10 $\mu C/cm^2$, 16 $\mu C/cm^2$, and 8 $\mu C/cm^2$, respectively.

Figure 6D:
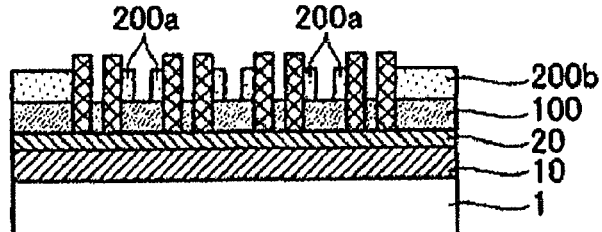

Thereafter, developing may be performed with a developer (e.g., TMAH) to remove the upper high-sensitivity negative resist 200 as well as to form a resist pattern 200b in the light-shielding band forming area (FIG. 6D).

Subsequently, by using the electron beam writing apparatus, writing may be further performed using a high dose amount H (e.g., 30 $\mu C/cm^2$) suitable for exposing the lower low-sensitivity positive resist 100 in the area except the light-shielding band forming area (FIG. 6D).

In this way, the written portions (depicted as crossed diagonal lines shown in FIG. 6D) of the lower low-sensitivity positive resist 100 may be removed by a subsequent developing.

Further, during this process, writing may be also performed on the resist 100 by compensating the dose amount according to the pattern density in the electron beam writing apparatus, in order to obtain CD accuracy as defined in a design value for desired patterns (a line-and-space (L&S) of 200 nm, an isolated line (ISO LINE) of 200 nm, and an isolation space (ISO SPACE) of 200 nm). For example, the compensated dose amounts of the line-and-space, the isolated line, and the isolation space may be 30 $\mu C/cm^2$, 23 $\mu C/cm^2$, and 46 $\mu C/cm^2$, respectively.

Figure 6E:
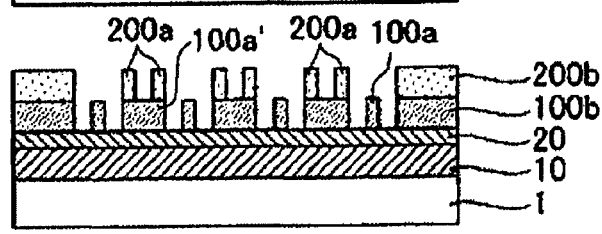

Thereafter, developing may be performed with a developer (e.g., TMAH) to form a resist patterns 100a along with a resist pattern made of a laminated body which is comprised of a resist pattern 100b and a resist pattern 200b in the light-shielding band forming area (FIG. 6E).

During such developing, the middle layer 300 may be dissolved and removed by the developer.

Figure 6F:
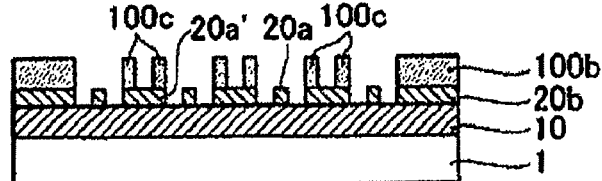
Figure 6G:
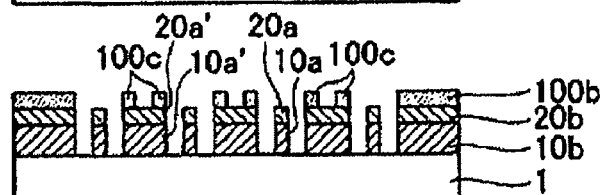

Next, dry-etching may be performed on the semi-transmitting film 10 being exposed using the resist patterns 20a and 20a' to form semi-transmitting film patterns 10a and 10a' (FIG. 6G). The dry-etching may be performed by using a dry-etching gas such as a mixed gas of $SF_6$ and He.

During this process, the resist pattern 100c on the light-shielding film pattern 20a' and the resist pattern 100b in the light-shielding band forming area may be about to be decreased, but left as much as film thicknesses required for a subsequent process at the dry-etching termination time.

Figure 6H:
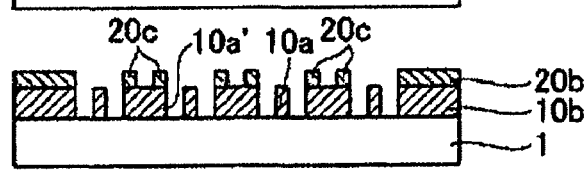

Next, dry-etching may be further performed on the light-shielding film pattern 20a' being exposed using the resist pattern 100c to form a light-shielding film pattern 20c (e.g., a patch) (FIG. 6H). Concurrently, the light-shielding film pattern 20a on the semi-transmitting film pattern 10a may be removed by the dry-etching while the light-shielding film pattern 20b (e.g., the light-shielding band) may be protected with the resist pattern 100b in the light-shielding band forming area (FIG. 6H). The dry-etching may be performed by using a dry-etching gas such as a mixed gas of $Cl_2$ and $O_2$ ($Cl_2:O_2=4:1$).

During this process, the resist pattern 100c on the light-shielding film pattern 20a' and the resist pattern 100b in the light-shielding band forming area may be removed.

Subsequently, cleaning may be performed on the resultant structure to fabricate a tri-tone phase shift mask for the ArF excimer laser. Such tri-tone phase shift mask may be provided with the light-shielding film pattern 20c (e.g., the patch) on the semi-transmitting film pattern 10a' and the light-shielding band made of a laminated body which is comprised of the light-shielding film pattern 20b and the semi-transmitting film pattern 10b in the light-shielding band forming area.

According to the above process of Example 6, the desired patterns (the line-and-space of 200 nm, the isolated line of 200 nm, and the isolation space of 200 nm) may be obtained in the CD accuracy as defined in the design value with respect to the semi-transmitting film patterns 10a and 10a' and the light-shielding film pattern 20c (e.g., the patch).

Also, a portion of the resist 200 whose the resist pattern of the isolated line of 200 nm is to be formed may not be removed along with the middle layer 300 underneath the portion.

Moreover, according to the above process of Example 6, the resist pattern of a 3-dimensional step shown in FIG. 6E may be formed by performing the continuous writing of FIGS. 6C and 6D at once and the developing two times. Therefore, it is possible to reduce the mask manufacturing process in comparison with a mask manufacturing process performing the writing, developing, and stripping two times, to thereby realize the decrease in a fabrication time and in cost. Further, according to the above process of Example 6, it is possible to increase mask fabrication accuracy since the writing was performed at once only to effectively prevent a writing position misalignment which may be induced by performing the applying, writing, developing, and stripping of a resist two times.

Further, according to the above process of Example 6, since the resist pattern may not be remained so that it is not required to perform the stripping and removing of the resist pattern.

Also, in the above process shown in FIGS. 6E and 6F, the relationship between "a nearly removing" of the resist patterns 200a, 200b and 100a and "a nearly remaining" of the resist patterns 100c (e.g., some of 100a') and 100b may be derived from same film thicknesses and same dry-etching rates of the resist 100 and the resist 200. Although the resist patterns 200a, 200b and 100a were remained in small amounts, it is not a critical problem because the resist patterns 200a, 200b and 100a can be securely removed by a subsequent dry-etching. Even though the resist patterns 100c (e.g., some of 100a') and 100b were over-etched, it is not a critical problem as long as the resist patterns 100c (e.g., some of 100a') and 100b can be remained to film thicknesses required for a subsequent process at the dry-etching termination time during the process shown in FIG. 6H.

REFERENCE EXAMPLE 4

In Examples 4 to 6, in case that a dissolution rate of the resist 100 against the developer is set to V and a dissolution rate of the middle layer 300 against the developer is over 5V, a portion of the resist 100 whose the resist pattern of the isolated line of 200 nm is to be formed may be removed along with the middle layer 300 underneath the portion.

This is the reason why the dissolution rate of the middle layer 300 against the developer is large so that the middle layer 300 in a fine pattern is removed.

Although exemplary embodiments have been described with reference to a number of illustrative examples thereof, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A blank mask, comprising:
   a substrate;
   a thin film formed on the substrate; and
   an electron beam resist film formed on the thin film,
   wherein the electron beam resist film is made of a laminated film comprising at least a lower resist film and an upper resist film, and
   the lower resist film and the upper resist film have different resist sensitivities with respect to an electron beam.

2. The mask blank of claim 1, wherein the lower resist film and the upper resist film are a negative-type, and a resist sensitivity of the upper resist film is lower than that of the lower resist film.

3. The mask blank of claim 1, wherein the lower resist film and the upper resist film are a positive-type, and a resist sensitivity of the upper resist film is higher than that of the lower resist film.

4. The mask blank of claim 1, wherein the lower resist film is a positive-type, the upper resist film is a negative-type, and a resist sensitivity of the upper resist film is higher than that of the lower resist film.

5. The mask blank of claim 1, wherein the lower resist film and the upper resist film are a chemically amplified resist.

6. The mask blank of claim 1, wherein the upper resist film is made of a material having a bake temperature lower than the lower resist film.

7. The mask blank of claim 1, wherein a film thickness of the lower resist film corresponds to that of the upper resist film.

8. The mask blank of claim 1, wherein a middle layer is interposed between the lower resist film and the upper resist film.

9. A method of manufacturing a mask blank, comprising:
   forming a thin film on a substrate;
   forming a lower electron beam resist film on the thin film; and
   forming an upper electron beam resist film on the lower electron beam resist film, or by interposing a middle layer between the lower electron beam resist film and the upper electron beam resist film,
   wherein the lower electron beam resist film and the upper electron beam resist film have different sensitivities with respect to an electron beam.

10. A method for manufacturing a transfer mask by using the mask blank according to claim 1, comprising:
    writing a high-sensitivity resist film out of the upper and lower electron beam resist films using a low dose amount;
    writing a low-sensitivity resist film out of the upper and lower electron beam resist films using a high dose amount; and
    forming a resist pattern having a step thereon.

11. A transfer mask manufactured by using the method according to claim 10.

* * * * *